US012603648B2

(12) United States Patent
Tanaka et al.

(10) Patent No.: US 12,603,648 B2
(45) Date of Patent: Apr. 14, 2026

(54) TERMINATION CIRCUIT AND SEMICONDUCTOR CIRCUIT

(71) Applicant: Sony Semiconductor Solutions Corporation, Kanagawa (JP)

(72) Inventors: Yoshinori Tanaka, Tokyo (JP); Takanori Saeki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 6 days.

(21) Appl. No.: 18/715,246

(22) PCT Filed: Nov. 15, 2022

(86) PCT No.: PCT/JP2022/042361
§ 371 (c)(1),
(2) Date: May 31, 2024

(87) PCT Pub. No.: WO2023/135922
PCT Pub. Date: Jul. 20, 2023

(65) Prior Publication Data
US 2025/0030419 A1     Jan. 23, 2025

(30) Foreign Application Priority Data

Jan. 11, 2022     (JP) ................................. 2022-002478

(51) Int. Cl.
*H03K 17/687*          (2006.01)
*H03K 5/133*           (2014.01)

(52) U.S. Cl.
CPC ......... *H03K 17/6872* (2013.01); *H03K 5/133* (2013.01)

(58) Field of Classification Search
CPC .............. H03K 17/6872; H03K 5/133; H03K 19/0175; H03K 19/0944; H03K 19/0005;
(Continued)

(56) References Cited

U.S. PATENT DOCUMENTS 6,686,763 B1     2/2004 Yen

FOREIGN PATENT DOCUMENTS

JP          H05276070 A          10/1993
JP          H11330944 A          11/1999
(Continued)

OTHER PUBLICATIONS

International Search Report (PCT/ISA/210), International Application No. PCT/JP2022/042361, dated Feb. 7, 2023.

*Primary Examiner* — Jung Kim
(74) *Attorney, Agent, or Firm* — Michael Best & Friedrich LLP

(57)          ABSTRACT

A termination circuit including: a first circuit provided in a first path that couples a first signal terminal and a first power supply node, the first circuit being configured to enable the first path; a second circuit provided in a second path that couples the first signal terminal and a second power supply node, the second circuit being configured to enable the second path; and a control circuit that is configured to perform a first operation including controlling an operation of the first circuit to enable the first path during a first period that corresponds to a rising edge of a first input signal at the first signal terminal, and controlling an operation of the second circuit to enable the second path during a second period that corresponds to a falling edge of the first input signal.

13 Claims, 16 Drawing Sheets

(58) Field of Classification Search
CPC ... H03K 19/017545; H03K 19/017554; H03K
19/017563; H03K 19/01825; H03K
19/01831; H03K 19/018557; H03K
19/018564; H03K 19/018571; H03K
19/018578; G06F 13/4086; H05K 1/0246
See application file for complete search history.

(56) References Cited

FOREIGN PATENT DOCUMENTS

| | | |
|---|---|---|
| JP | 2000059444 A | 2/2000 |
| JP | 2000261508 A | 9/2000 |
| JP | 2004096351 A | 3/2004 |

[ FIG. 1 ]
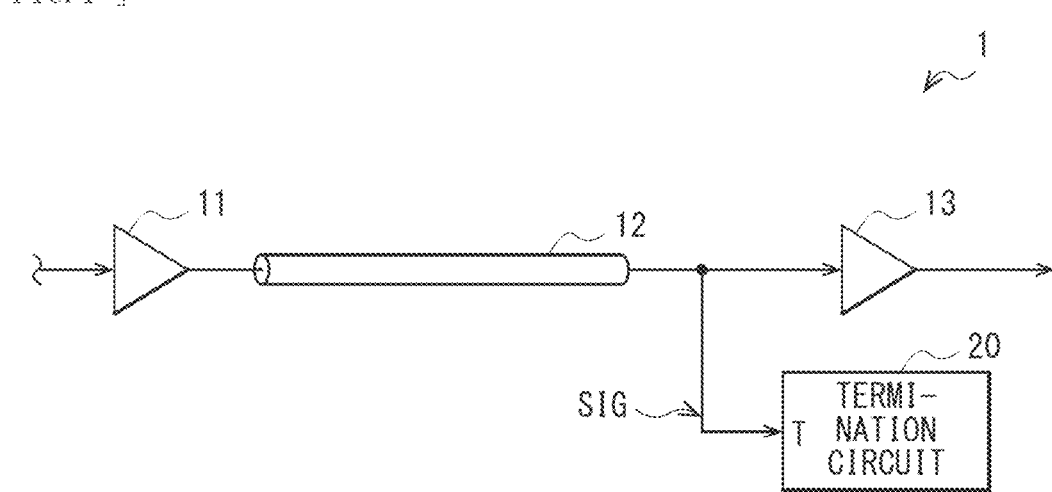
[ FIG. 2 ]
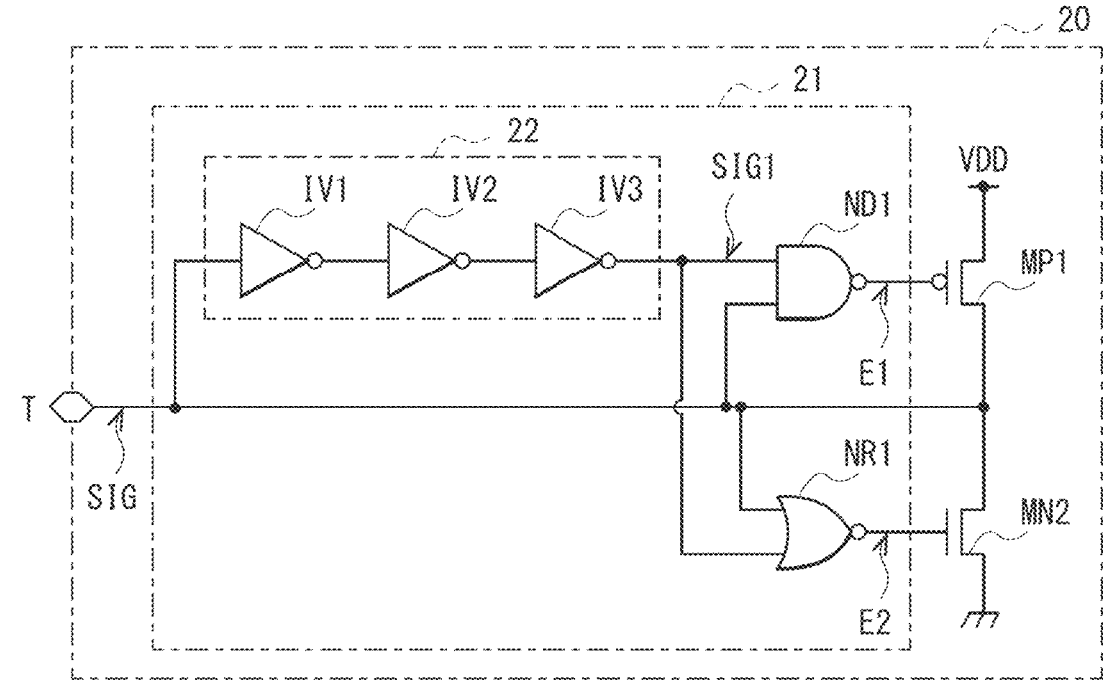

[ FIG. 3 ]
(A) SIGNAL SIG
(B) SIGNAL SIG1
(C) SIGNAL E1 ← P1
(D) SIGNAL E2 ← P2
(E) CURRENT Ichg
(F) CURRENT Idischg
0.5n    1n    1.5n    2n
[ FIG. 4 ]
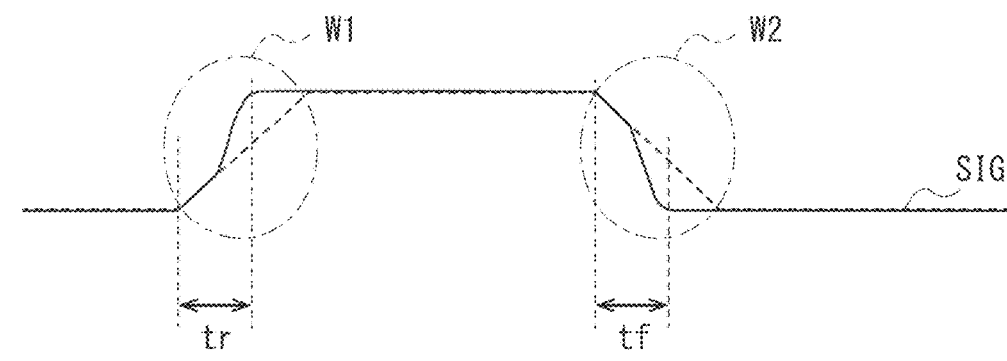

[ FIG. 5 ]
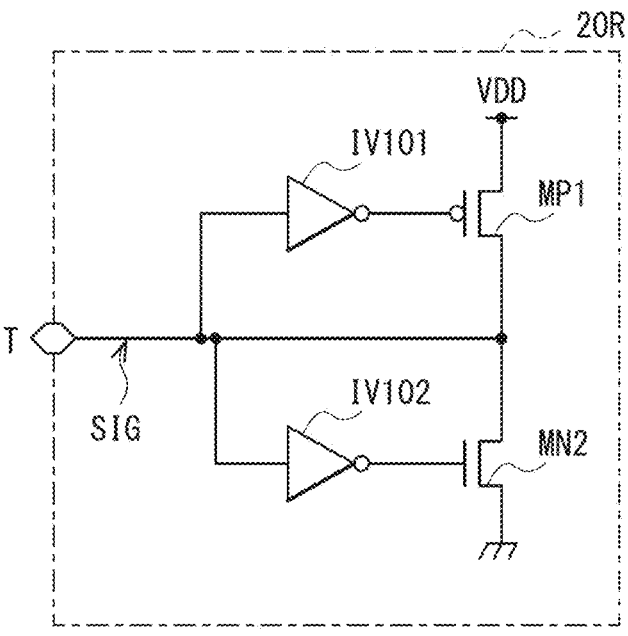
[ FIG. 6 ]
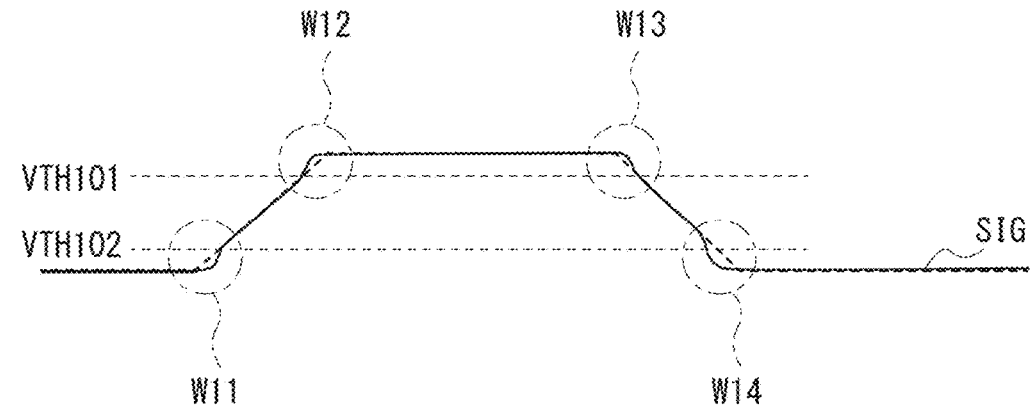

[ FIG. 7 ]
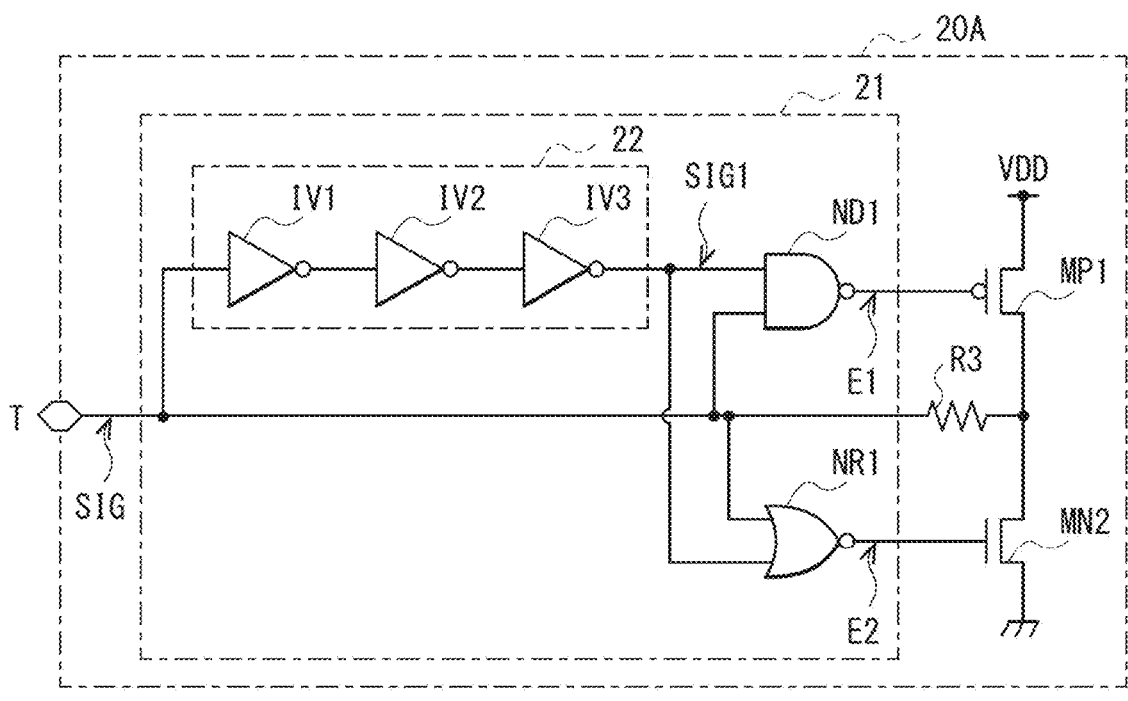
[ FIG. 8 ]
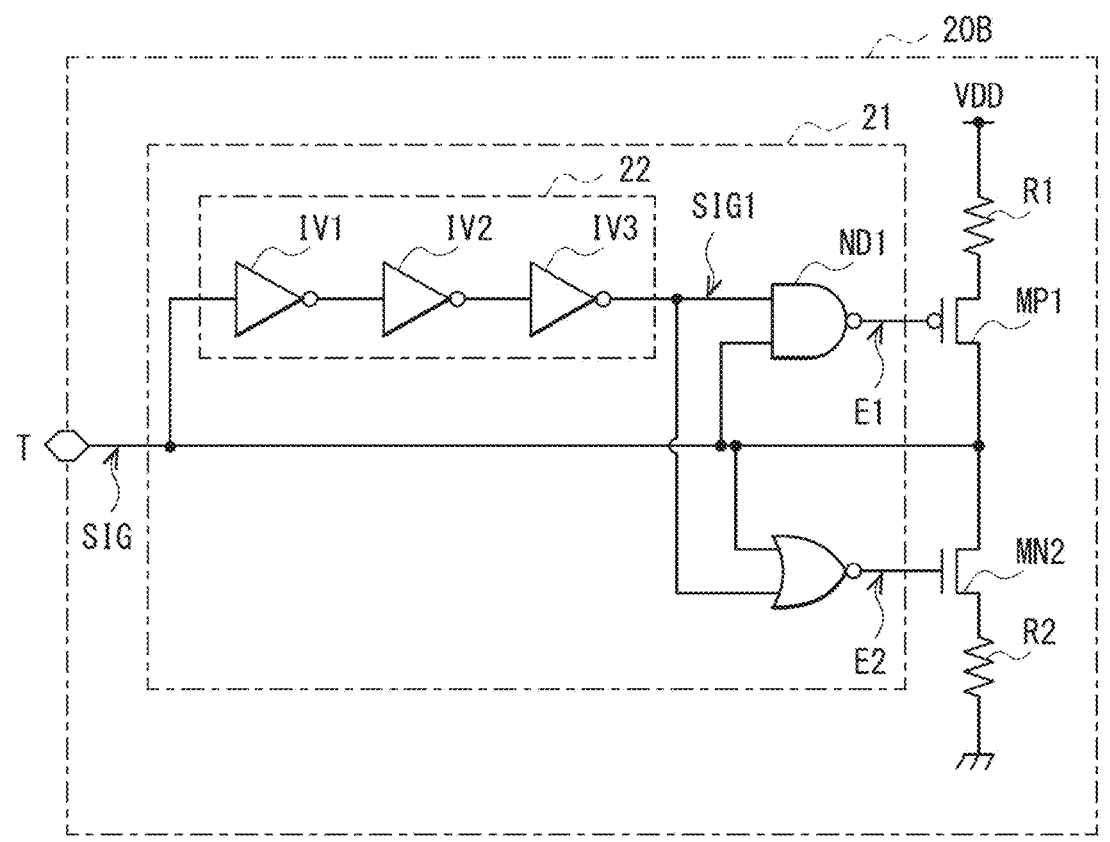

[ FIG. 9 ]
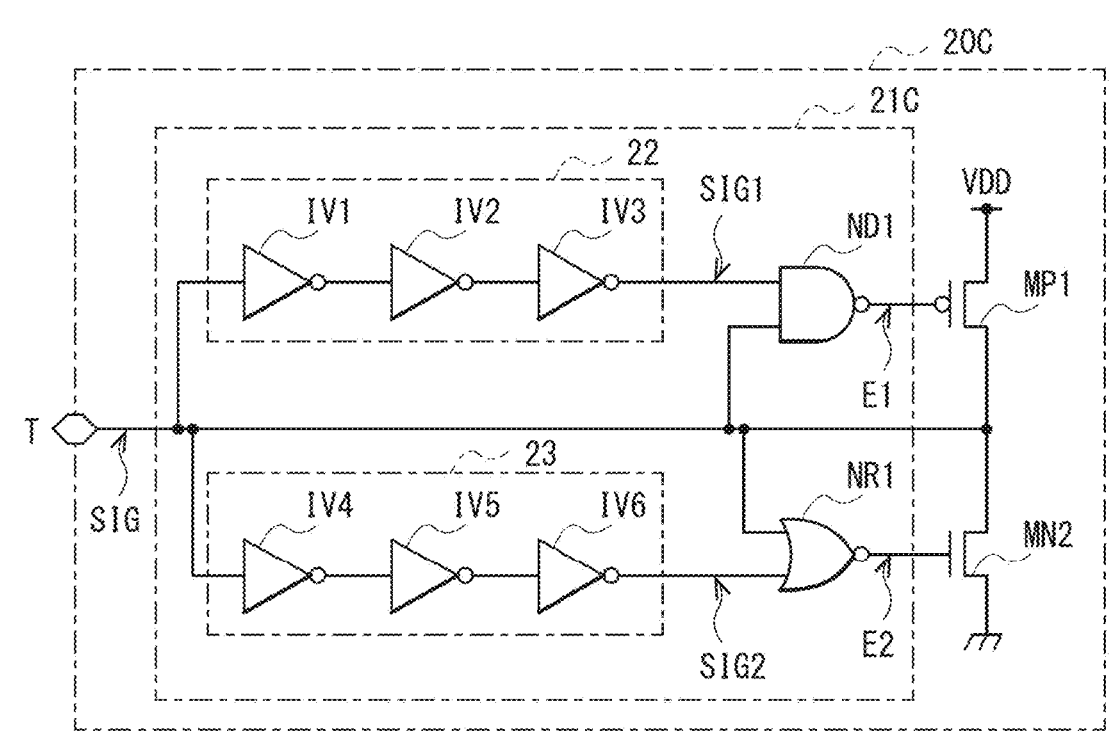

[ FIG. 11 ]
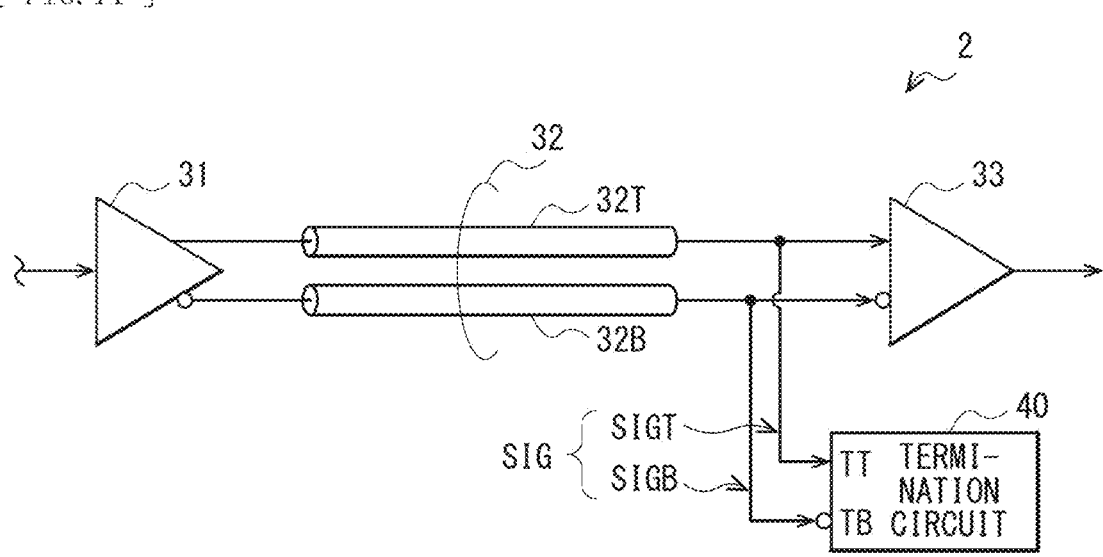

[ FIG. 12 ]
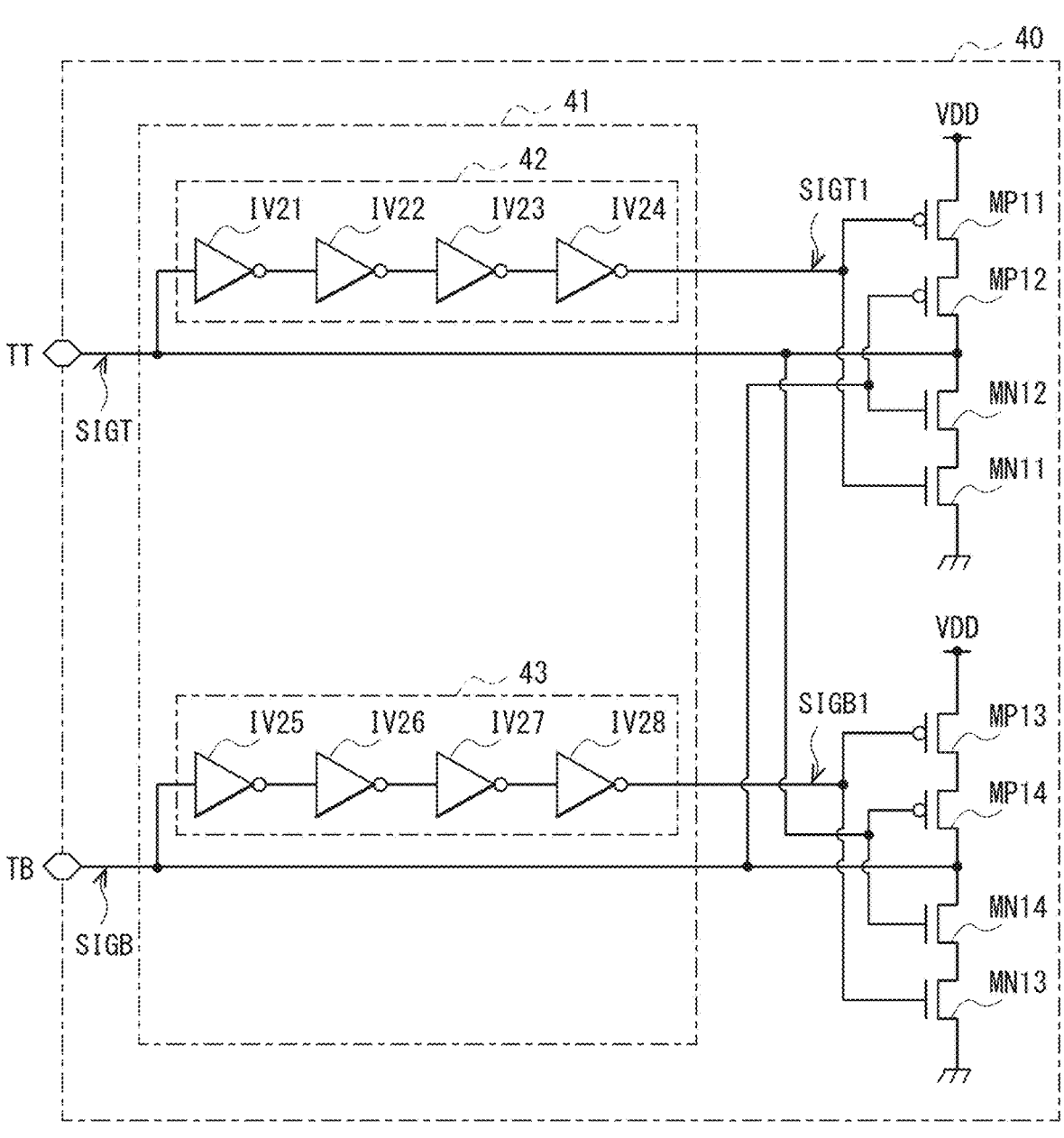

[ FIG. 13 ]
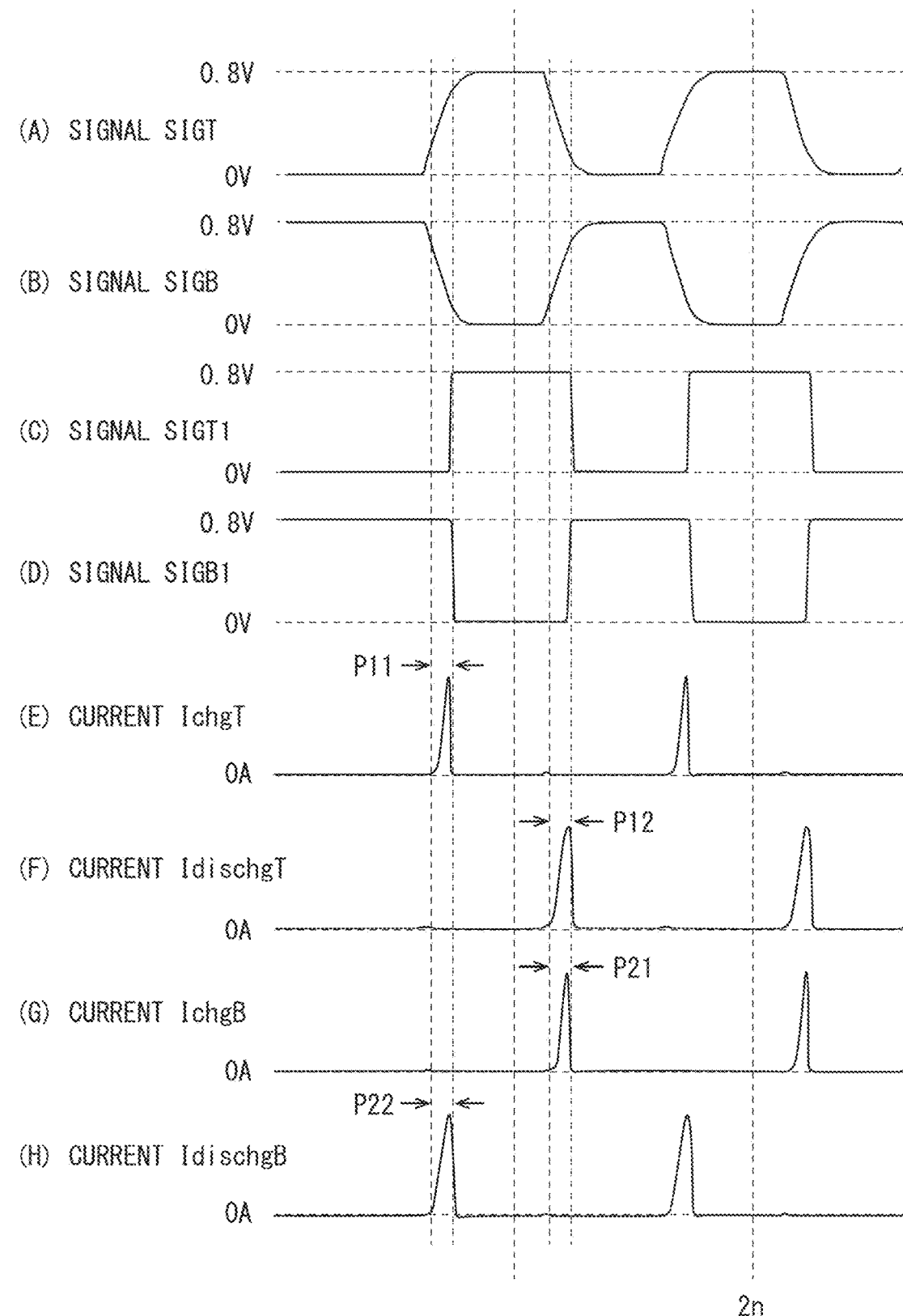

[ FIG. 14 ]
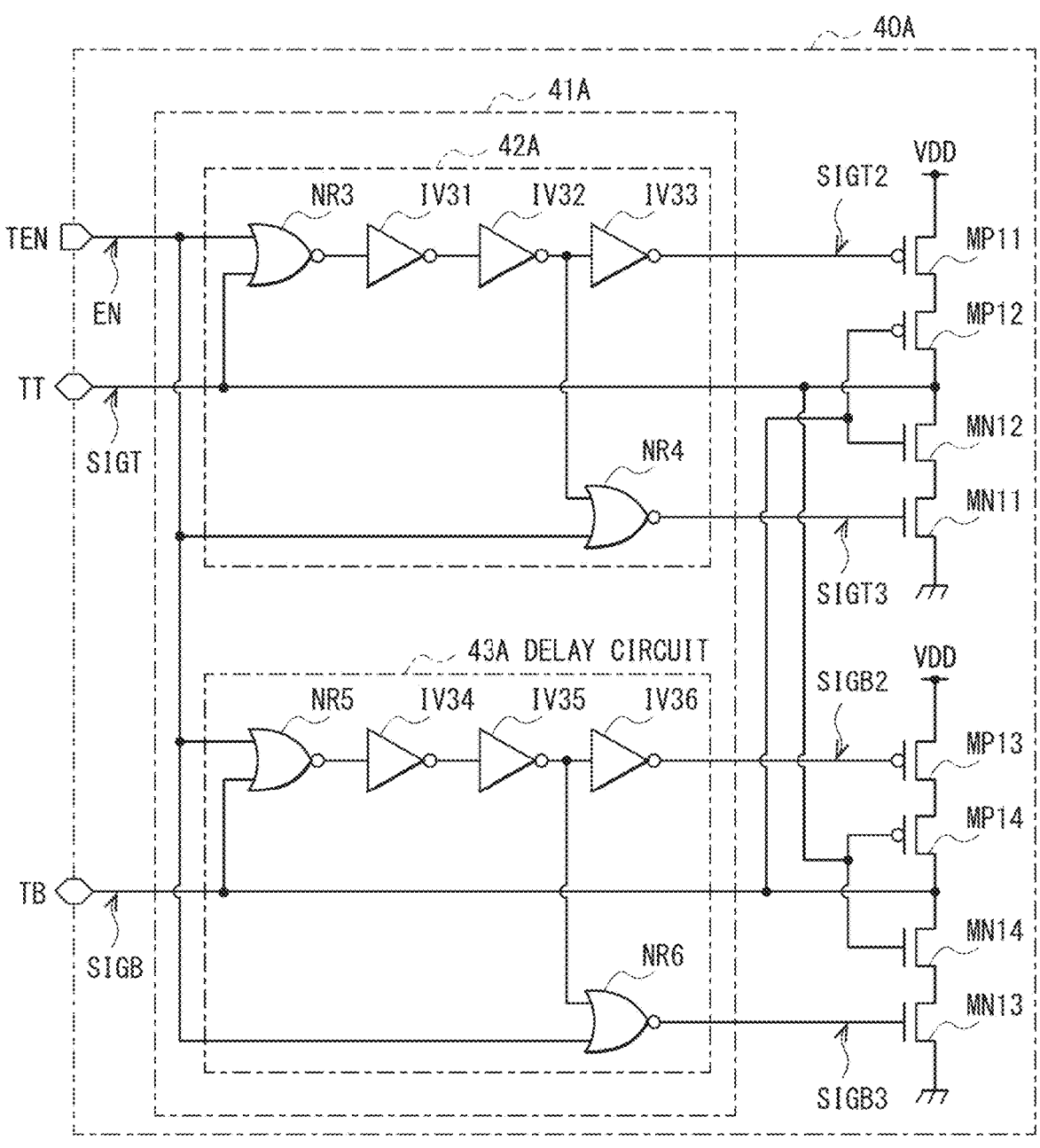

[ FIG. 15 ]
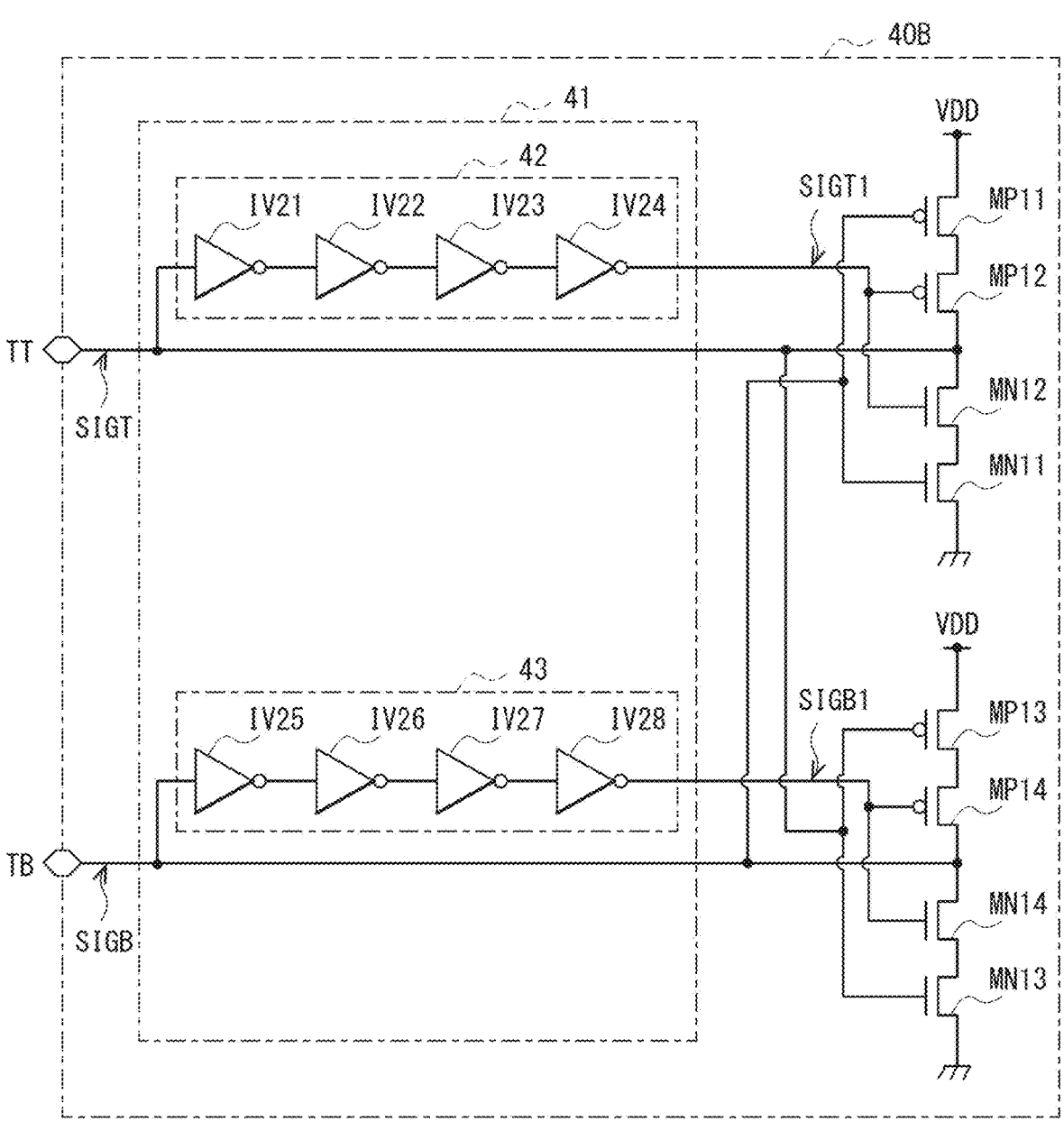

[ FIG. 16 ]
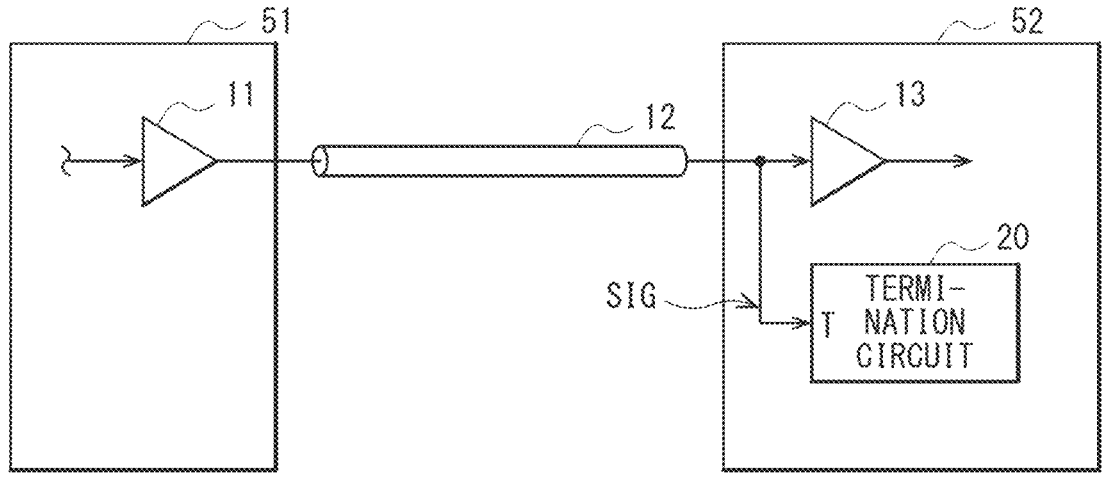
[ FIG. 17 ]
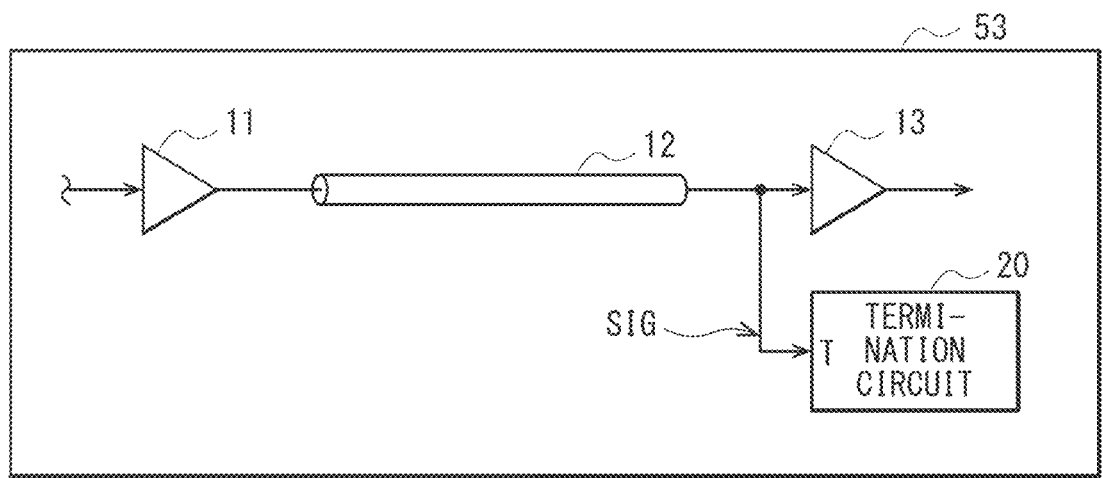

[ FIG. 18 ]
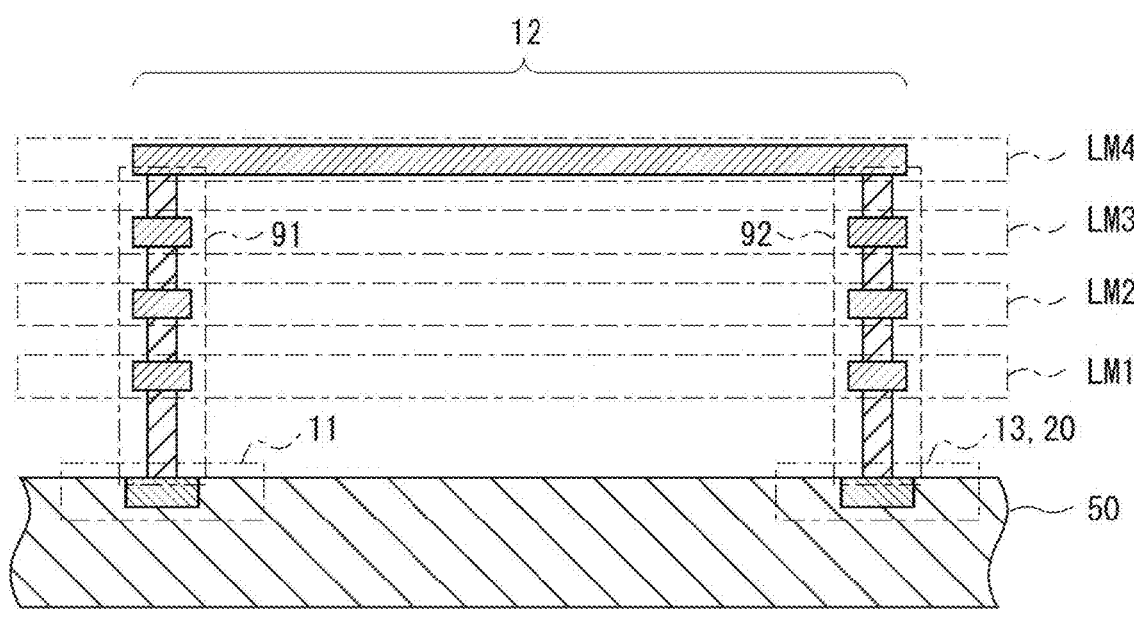

TERMINATION CIRCUIT AND SEMICONDUCTOR CIRCUIT

TECHNICAL FIELD

The present disclosure relates to a termination circuit and a semiconductor circuit.

BACKGROUND ART

In electronic circuits, signals are exchanged between circuits through a signal wiring. Patent Literature 1, for example, discloses a dynamic termination circuit that terminates the signal wiring.

CITATION LIST

Patent Literature

PTL 1: Japanese Patent Unexamined Application Publication No. H11-330944

SUMMARY OF THE INVENTION

Electronic circuits, which desirably have high signal waveform quality, are expected to be further improved in waveform quality.

It is desirable to provide termination circuits and semiconductor circuits that make it possible to increase signal waveform quality.

A termination circuit of one embodiment of the present disclosure includes a first circuit, a second circuit, and a control circuit. The first circuit is provided in a first path that couples a first signal terminal and a first power supply node and is configured to enable the first path. The second circuit is provided in a second path that couples the first signal terminal and a second power supply node and is configured to enable the second path. The control circuit is configured to perform a first operation that includes controlling the operation of the first circuit to enable the first path during a first period that corresponds to a rising edge of a first input signal at the first signal terminal, and controlling the operation of the second circuit to enable the second path during a second period that corresponds to a falling edge of the first input signal.

A semiconductor circuit in one embodiment of the present disclosure includes a signal wiring, a first circuit, a second circuit, and a control circuit. The first circuit is provided in a first path that couples a first signal terminal, which is coupled to the signal wiring, and a first power supply node, and is configured to enable the first path. The second circuit is provided in a second path that couples the first signal terminal and a second power supply node, and is configured to enable the second path. The control circuit is configured to perform a first operation that includes controlling the operation of the first circuit to enable the first path during a first period that corresponds to a rising edge of a first input signal at the first signal terminal, and controlling the operation of the second circuit to enable the second path during a second period that corresponds to a falling edge of the first input signal.

In the termination circuit and the semiconductor circuit in one embodiment of the present disclosure, a first circuit that is configured to enable the first path is provided in the first path that couples the first signal terminal and the first power supply node, and a second circuit that is configured to enable the second path is provided in the second path that couples the first signal terminal and the second power supply node. The first path is set enabled during a first period that corresponds to a rising edge of the first input signal, and the second path is set enabled during a second period that corresponds to a falling edge of the first input signal.

BRIEF DESCRIPTION OF DRAWING

FIG. 1 is a block diagram illustrating an example configuration of an electronic circuit according to a first embodiment of the present disclosure.

FIG. 2 is a circuit diagram illustrating an example configuration of the termination circuit illustrated in FIG. 1.

FIG. 3 is a timing waveform diagram illustrating an example operation of the termination circuit illustrated in FIG. 2.

FIG. 4 is a waveform diagram illustrating example waveforms of a signal in the electronic circuit illustrated in FIG. 1.

FIG. 5 is a circuit diagram illustrating an example configuration of a termination circuit according to a comparative example.

FIG. 6 is a waveform diagram illustrating example waveforms of a signal in an electronic circuit according to the comparative example.

FIG. 7 is a circuit diagram illustrating an example configuration of a termination circuit according to a modification of the first embodiment.

FIG. 8 is a circuit diagram illustrating an example configuration of a termination circuit according to another modification of the first embodiment.

FIG. 9 is a circuit diagram illustrating an example configuration of a termination circuit according to still another modification of the first embodiment.

FIG. 11 is a block diagram illustrating an example configuration of an electronic circuit according to a second embodiment.

FIG. 12 is a circuit diagram illustrating an example configuration of the termination circuit illustrated in FIG. 11.

FIG. 13 is a timing waveform diagram illustrating an example of the operation of the termination circuit illustrated in FIG. 12.

FIG. 14 is a circuit diagram illustrating an example configuration of a termination circuit according to a modification of the second embodiment.

FIG. 15 is a circuit diagram illustrating an example configuration of a termination circuit according to another modification of the second embodiment.

FIG. 16 is a block diagram illustrating an example configuration of an electronic circuit according to an example of application.

FIG. 17 is a block diagram illustrating an example configuration of an electronic circuit according to another example of application.

FIG. 18 is a structural diagram illustrating an example configuration of the signal wiring illustrated in FIG. 17.

MODES FOR CARRYING OUT THE INVENTION

Figure 10:
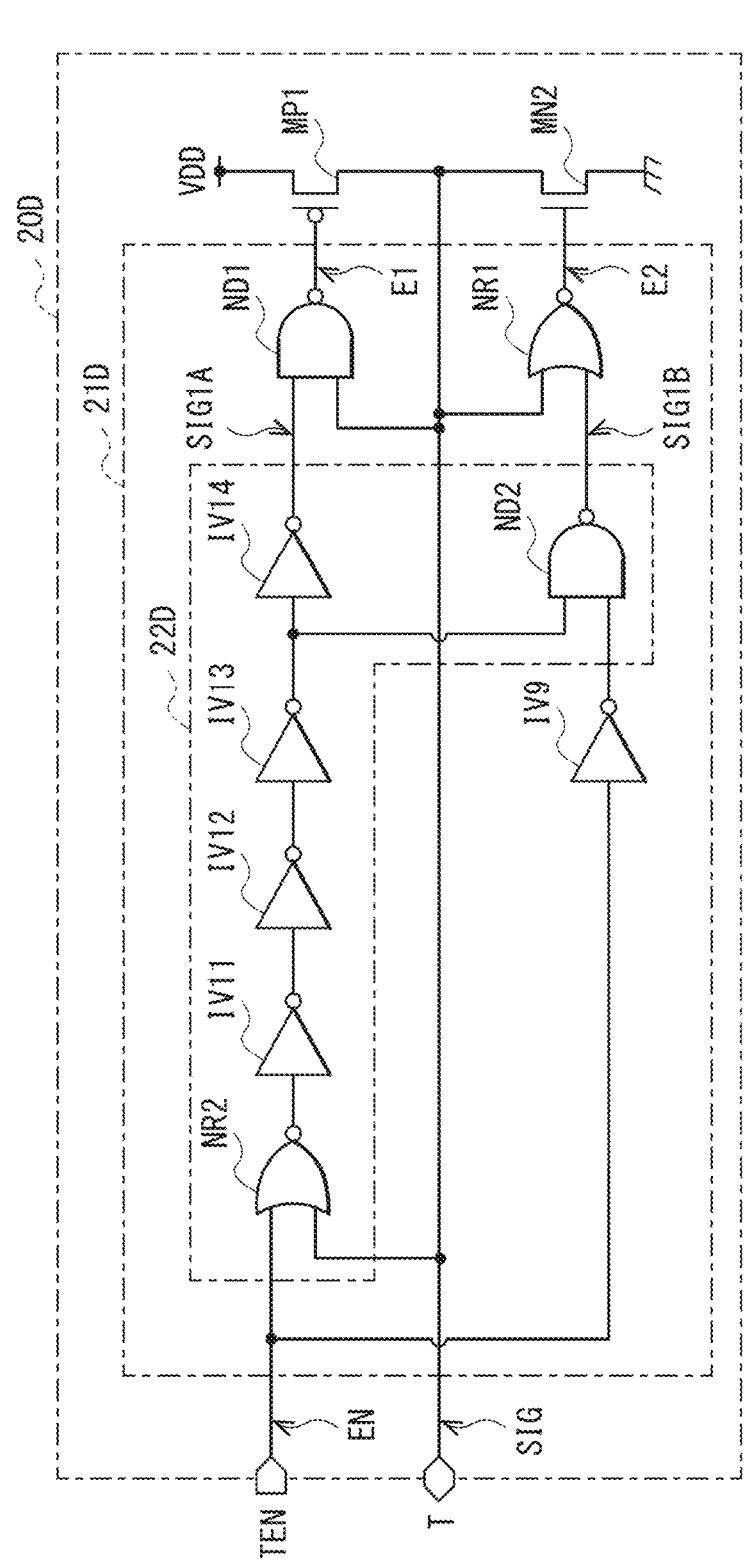
FIG. 10 is a circuit diagram illustrating an example configuration of a termination circuit according to yet another modification of the first embodiment.

Embodiments of the present disclosure will now be described in detail with reference to the accompanying drawings. Note that the description will be given in the following order.

1. First Embodiment (example of single-phase signal)
2. Second Embodiment (example of differential signal)
3. Example of Application

1. First Embodiment

Configuration Example

FIG. 1 illustrates an example configuration of an electronic circuit 1 including a termination circuit according to the first embodiment. The electronic circuit 1 includes a driver 11, a signal wiring 12, a receiver 13, and a termination circuit 20.

The driver 11 is configured to drive the signal wiring 12 on the basis of signals supplied from the preceding circuit. The signal wiring 12 is a wiring that carries the signal transmitted from the driver 11. This signal wiring 12 may be, for example, a wiring within a semiconductor chip or a transmission line between multiple semiconductor chips. The receiver 13 is configured to receive a signal SIG transmitted from the driver 11 via the signal wiring 12. The termination circuit 20 is configured to terminate the signal wiring 12. The signal terminal T of the termination circuit 20 is designed to be supplied with the signal SIG.

FIG. 2 illustrates an example configuration of the termination circuit 20. The termination circuit 20 includes a control circuit 21 and transistors MP1 and MN2.

The control circuit 21 is configured to generate signals E1 and E2 on the basis of the signal SIG input to the signal terminal T. The control circuit 21 includes a delay circuit 22, a negative logical AND (NAND) circuit ND1, and a negative logical OR (NOR) circuit NR1.

The delay circuit 22 is configured to delay the signal SIG and invert the signal SIG to generate a signal SIG1. The delay circuit 22 includes inverters IV1 to IV3. The inverter IV1 is configured to invert the signal SIG and output the inverted signal. The inverter IV2 is configured to invert the output signal of the inverter IV1 and output the inverted signal. The inverter IV3 is configured to invert the output signal of the inverter IV2 and output the inverted signal as the signal SIG1.

The negative logical AND circuit ND1 is configured to determine the negative logical AND of the signals SIG and SIG1 and output the obtained result as the signal E1.

The negative logical OR circuit NR1 is configured to determine the negative logical OR of the signals SIG and SIG1 and output the obtained result as the signal E2.

This configuration allows the control circuit 21 to generate the signal E1 in which a pulse occurs during a period that corresponds to a rising edge of the signal SIG. The control circuit 21 is also designed to generate the signal E2 in which a pulse occurs during a period that corresponds to a falling edge of the signal SIG.

The transistor MP1 is a p-type metal oxide semiconductor (MOS) transistor and has a gate supplied with the signal E1, a source coupled to the power supply node of power supply voltage VDD, and a drain coupled to the signal terminal T. In a case where the transistor MP1 is in the on state, the impedance between the drain and source of the transistor MP1 is set to, for example, a value approximately equal to the characteristic impedance of the signal wiring 12.

The transistor MN2 is an n-type MOS transistor and has a gate supplied with the signal E2, a drain coupled to the signal terminal T, and a source coupled to the ground node. In a case where the transistor MN2 is in the on state, the impedance between the drain and source of the transistor MN2 is set to, for example, a value approximately equal to the characteristic impedance of the signal wiring 12.

Here, the signal terminal T corresponds to one specific example of a "first signal terminal" of one embodiment of the present disclosure. The transistor MP1 corresponds to one specific example of a "first transistor" of one embodiment of the present disclosure. The transistor MN2 corresponds to one specific example of a "second transistor" of one embodiment of the present disclosure. The control circuit 21 corresponds to one specific example of a "control circuit" of one embodiment of the present disclosure. The signal SIG corresponds to one specific example of a "first input signal" of one embodiment of the present disclosure. The delay circuit 22 corresponds to one specific example of a "delay circuit" of one embodiment of the present disclosure. The signal E1 corresponds to one specific example of a "first signal" of one embodiment of the present disclosure. The signal E2 corresponds to one specific example of a "second signal" of one embodiment of the present disclosure.

[Operation and Working]

The operation and working of the electronic circuit 1 of this embodiment will now be described.

(Overview of Overall Operation)

First, an overview of the overall operation of the electronic circuit 1 will be described with reference to FIGS. 1 and 2. In the electronic circuit 1, the driver 11 drives the signal wiring 12 on the basis of a signal supplied from the preceding circuit. The signal wiring 12 carries the signal transmitted from the driver 11. The receiver 13 receives the signal SIG transmitted from the driver 11 via the signal wiring 12. In the termination circuit 20, the delay circuit 22 delays the signal SIG and inverts the signal SIG to generate the signal SIG1. The negative logical AND circuit ND1 determines the negative logical AND of the signal SIG and the signal SIG1 and outputs the obtained result as the signal E1. The negative logical OR circuit NR1 determines the negative logical AND of the signal SIG and the signal SIG1 and outputs the obtained result as the signal E2. The transistor MP1 operates on the basis of the signal E1, and the transistor MN2 operates on the basis of the signal E2.

(Detailed Operation)

FIG. 3 illustrates an example of the operation of the termination circuit 20. (A) illustrates the waveform of the signal SIG, (B) illustrates the waveform of the signal SIG1, (C) illustrates the waveform of the signal E1, (D) illustrates the waveform of the signal E2, (E) illustrates the waveform of current Ichg flowing from the source to drain of the transistor MP1, and (F) illustrates the waveform of current Idischg flowing from the drain to source of the transistor MN2.

The delay circuit 22 delays the signal SIG and inverts the signal SIG to generate the signal SIG1 (see FIGS. 3(A) and (B)). The negative logical AND circuit ND1 determines the negative logical AND of the signal SIG and the signal SIG1 and outputs the obtained result as the signal E1 (FIG. 3(C)). To be specific, the negative logical AND circuit ND1 generates the signal E1 in which a pulse occurs during the period P1 from the time when the signal SIG rises to the time when the signal SIG1 falls. During the periods other than the periods P1 in which a pulse occurs, the signal E1 is at a high level (0.8 V in this example), and during the periods P1, the voltage of the signal E1 is lower than this high level. In this example, in which the length of time of the periods P1 is short, the signal E1 does not reach the low level, 0 V, but the signal E1 may be made reach the low level (0 V), for example, by making the length of time of the periods P1 longer. On the basis of such signal E1, the transistor MP1 is transiently in the on state during the period P1 corresponding to a rising edge of the signal SIG, and the current Ichg flows from the source to drain of the transistor MP1 (FIG. 3(E)).

The negative logical OR circuit NR1 determines the negative logical OR of the signals SIG and SIG1 and outputs the obtained result as the signal E2 (FIG. 3(D)). To be specific, the negative logical OR circuit NR1 generates the signal E2 in which a pulse occurs during a period P2 from the time when the signal SIG falls to the time when the signal SIG1 rises. During the periods other than the periods P2 in which a pulse occurs, the signal E2 is at a low level (0 V in this example), and during the periods P2, the voltage of the signal E2 is higher than this low level. In this example, in which the length of time of the periods P2 is short, the signal E2 does not reach the high level, 0.8 V, but the signal E2 may be made reach the high level (0.8 V), for example, by making the length of time of the periods P2 longer. On the basis of such signal E2, the transistor MN2 is transiently in the on state during the period P2 corresponding to a falling edge of the signal SIG, and the current Idischg flows from the drain to source of the transistor MN2 (FIG. 3(F)).

Thus, in the termination circuit 20, the transistor MP1 is transiently brought into the on state during the period P1 corresponding to a rising edge of the signal SIG, and transistor MN2 is transiently brought into the on state during the period P2 corresponding to a falling edge of the signal SIG. Hence, the signal wiring 12 is transiently terminated during the periods P1 and P2 when the signal SIG changes. To be specific, during the period P1, the termination path that couples the signal terminal T and the power supply node of the power supply voltage VDD is enabled, and during the period P2, the termination path that couples the signal terminal T and the ground node is enabled. In other words, dynamic termination operation is performed in the termination circuit 20. This makes it possible to suppress reflections and suppress ringing in the electronic circuit 1. This makes it possible to increase the waveform quality of the signal SIG.

In the termination circuit 20, it is possible to improve the characteristics, for example, by adjusting the logic thresholds of the negative logical AND circuit ND1 and the negative logical OR circuit NR1. To be specific, for example, in a case where the logic threshold for the signal SIG in the negative logical AND circuit ND1 is made low, it is possible to bring the transistor MP1 into the on state earlier when the signal SIG begins to rise. Similarly, for example, in a case where the logic threshold for the signal SIG in the negative logical OR circuit NR1 is made high, it is possible to bring the transistor MN1 into the on state earlier when the signal SIG begins to fall. This allows, for example, the periods P1 and P2 to be set to match the time when the signal SIG changes, even in a case where the rise time tr and fall time tf of the signal SIG are short, making it possible to obtain adequate effect of the termination operation.

For example, in a case where the load is heavy with many load circuits coupled to the signal wiring 12 as in a so-called clock tree, the rise time tr and fall time tf of the signal SIG may become long. The termination circuit 20 thus makes it possible to shorten the rise time tr and fall time tf even in a case where the rise time tr and fall time tf of the signal SIG are long.

FIG. 4 illustrates an example of the waveforms of the signal SIG in a case where the rise time tr and fall time tf of the signal SIG are long. In FIG. 4, the solid line indicates a case where the termination circuit 20 is provided, and the dashed line indicates a case where the termination circuit 20 is not provided. Note that in this FIG. 4, the operation is depicted with emphasis.

As illustrated in FIG. 3, in a case where the signal SIG changes from a low level to a high level, the transistor MP1 transiently goes into the on state. This causes the transistor MP1 to conduct the current Ichg, thereby making the voltage of the signal SIG rise more quickly toward a high level (portion W1) as illustrated in FIG. 4. In other words, the termination circuit 20 assists the voltage of the signal SIG to rise. In this way, the rise time tr of the signal SIG is shorter than without the termination circuit 20.

Similarly, as illustrated in FIG. 3, in a case where the signal SIG changes from a high level to a low level, the transistor MN2 transiently goes into the on state. This causes the transistor MN2 to conduct the current Idischg, thereby making the voltage of the signal SIG decrease quickly toward a low level (portion W2) as illustrated in FIG. 4. In other words, the termination circuit 20 assists the voltage of the signal SIG to decrease. In this way, the fall time tf of the signal SIG is shorter than without the termination circuit 20.

Thus, in the electronic circuit 1, it is possible to shorten the rise time tr and fall time tf of the signal SIG, thereby increasing the waveform quality of the signal SIG. For example, in a case where the rise time tr and fall time tf of the signal SIG are long, for example, in the circuit to which this signal SIG is input, the flow-through current from the power supply node to the ground node may increase. There is also possibility that the delay time of the signal SIG increases. In the electronic circuit 1, in which the termination circuit 20 is provided, it is possible to shorten the rise time tr and fall time tf of the signal SIG, for example, in a case where the load is heavy with many load circuits coupled to the signal wiring 12. This allows, for example, the flow-through current from the power supply node to the ground node to be suppressed and the delay time of the signal SIG to be reduced.

Comparative Example

An electronic circuit according to a comparative example will now be described. Similarly to the electronic circuit 1 (FIG. 1) according to this embodiment, the electronic circuit according to the comparative example includes a driver 11, a signal wiring 12, a receiver 13, and a termination circuit 20R. This termination circuit 20R brings the transistor MP1 into the on state in a case where the signal SIG is at a high level and brings the transistor MN2 into the on state in a case where the signal SIG is at a low level.

FIG. 5 illustrates an example configuration of the termination circuit 20R according to the comparative example. The termination circuit 20R includes inverters IV101 and IV102 and transistors MP1 and MN2.

The inverter IV101 is configured to invert the signal SIG and output the inverted signal. The logic threshold VTH101 of the inverter IV101 is set to, for example, a voltage higher than the median of the power supply voltage VDD and the ground voltage.

The Inverter IV102 is configured to invert the signal SIG and output the inverted signal. The logic threshold VTH102 of the inverter IV102 is set, for example, to a voltage lower than the median of the power supply voltage VDD and the ground voltage.

With this configuration, in the termination circuit 20R, in a case where the voltage of the signal SIG is higher than the logic threshold VTH101 of the inverter IV101, the transistor MP1 is designed to go into the on state, and in a case where the voltage of the signal SIG is lower than the logic threshold VTH102 of the inverter IV102, the transistor MN2 is designed to go into the on state.

FIG. 6 illustrates an example of the waveforms of the signal SIG. In FIG. 6, the solid line illustrates a case where the termination circuit 20R is provided, and the dashed line illustrates a case where the termination circuit 20R is not provided.

When the signal SIG changes from a low level to a high level, in a case where the voltage of the signal SIG is lower than the logic threshold VTH102 of the inverter IV102, the transistor MN2 is in the on state, which causes the voltage of the signal SIG to be unlikely to rise (portion W11). In other words, the transistor MN2 in the on state inhibits arise in the voltage of the signal SIG. When the signal SIG rises and the voltage of the signal SIG goes higher than the logic threshold VTH101 of the inverter IV101, the transistor MP1 goes into the on state, which causes the voltage of the signal SIG to rise quickly (portion W12). In other words, the transistor MP1 in the on state assists the voltage of the signal SIG to rise.

On the contrary, when the signal SIG changes from a high level to a low level, in a case where the voltage of the signal SIG is higher than the logic threshold VTH101 of the inverter IV101, the transistor MP1 is in the on state, which causes the voltage of the signal SIG to be unlikely to decrease (portion W13). In other words, the transistor MP1 in the on state inhibits a decrease in the voltage of the signal SIG. When the signal SIG decreases and the voltage of the signal SIG goes lower than the logic threshold VTH102 of the inverter IV102, the transistor MN2 goes into the on state, causing the voltage of the signal SIG to decrease quickly (portion W14). In other words, the transistor MN2 in the on state assists the voltage of the signal SIG to decrease.

Thus, in the termination circuit 20R according to the comparative example, in the portion W11, the transistor MN2 inhibits a rise in the voltage of the signal SIG. In this case, in the electronic circuit, current flows to the driver 11, a signal wiring 12, and then transistor MN2, which may lead to increased power consumption. Similarly, in the portion W13, the transistor MP1 inhibits a decrease in the voltage of the signal SIG. In this case, in the electronic circuit including this termination circuit 20R, current flows to the transistor MP1, a signal wiring 12, and then driver 11, which may lead to increased power consumption. Besides, since the voltage of the signal SIG is made less likely to change in this manner, the delay of the signal SIG may increase.

In addition, in the termination circuit 20R according to the comparative example, the logic threshold VTH101 of the inverter IV101 is set to, for example, a voltage higher than the median of the power supply voltage VDD and the ground voltage, and the logic threshold VTH102 of the inverter IV102 is set to, for example, a voltage lower than the median of the power supply voltage VDD and the ground voltage. Thus, in a case where the rise time tr or fall time tf of the signal SIG is short, the operation in which the transistors MP1 and MN2 go into the on state may not be completed in time, which may result in insufficient effect of the termination operation.

In particular, the power supply voltage of circuits has become lower in recent years, and depending on the semiconductor circuit manufacturing variation, the logic thresholds may deviate significantly from the desired values. For example, in a case where the logic threshold VTH101 is higher than the desired value and the logic threshold VTH102 is lower than the desired value, the effect of the termination operation may be insufficient. In contrast, in a case where the logic threshold VTH101 is lower than the desired value and the logic threshold VTH102 is higher than the desired value, the transistors MP1 and MN2 are likely to go into the on state simultaneously, in which case the flow-through current from the power supply node to the ground node may increase.

On the contrary, in the termination circuit 20 according to this embodiment, as illustrated in FIG. 4, in a case where the signal SIG changes from a low level to a high level, the transistor MP1 may go into the on state, but the transistor MN2 stays in the off state. Consequently, the transistor MN2 does not inhibit a rise in the voltage of the signal SIG. In a case where the signal SIG changes from a high level to a low level, the transistor MN2 may go into the on state, but the transistor MP1 stays in the off state. For this reason, the transistor MP1 does not inhibit a decrease in the voltage of the signal SIG. The transistors MP1 and MN2 do not inhibit a change in the voltage of the signal SIG in this manner, which prevents an increase in power consumption and an increase in the delay of the signal SIG.

In the termination circuit 20 according to this embodiment, the transistor MN1 goes into the on state during a period P1 corresponding to a rising edge of the signal SIG, and the transistor MP2 goes into the on state during a period P2 corresponding to a falling edge of the signal SIG. This prevents the transistors MP1 and MN2 from going into the on state simultaneously, thereby reducing the possibility that a flow-through current flows. This eliminates the necessity of adjustment of logic thresholds like in the termination circuit 20R according to the comparative example, and allows the termination circuit 20 to operate stably, for example, even in a case where the power supply voltage is low or there is a significant semiconductor circuit manufacturing variation.

Thus, the termination circuit 20 is provided with a first circuit (transistor MP1) that is provided in the first path that couples the signal terminal T and the power supply node of the power supply voltage VDD and is configured to enable the first path, and a second circuit (transistor MN2) that is provided in the second path that couples the signal terminal T and the ground node and is configured to enable the second path. The termination circuit 20 is also provided with a control circuit 21 that controls the operation of the first circuit (transistor MP1) to enable the first path during a first period (period P1) corresponding to a rising edge of the signal SIG at the signal terminal T, and controls the operation of the second circuit (transistor MN2) to enable the second path during a second period (period P2) corresponding to a falling edge of the signal SIG. This allows the termination circuit 20 to perform dynamic termination operation, making it possible to suppress reflections and suppress ringing in the electronic circuit 1. Further, it is possible to shorten the rise time tr and fall time tf of the signal SIG. This makes it possible to increase the waveform quality of the signal SIG in the termination circuit 20.

Effects

As described above, in this embodiment, provided are the first circuit that is provided in the first path that couples the signal terminal and the power supply node of the power supply voltage and is configured to enable the first path; the second circuit that is provided in the second path that couples the signal terminal and the ground node and is configured to enable the second path; and the control circuit that controls the operation of the first circuit to enable the first path during a first period that corresponds to a rising edge of the signal at the signal terminal, and controls the operation of the second circuit to enable the second path during a second period that corresponds to a falling edge of the signal. This makes it possible to increase the waveform quality of the signal.

Modification 1-1

Although in the aforementioned embodiment, the transistor MP1 is provided in the path that couples the signal terminal T and the power supply node of the power supply voltage VDD, and the transistor MN2 is provided in the path that couples the signal terminal T and the ground node, this is not necessarily the case. For example, a resistor(s) may be further provided, as in the termination circuit 20A illustrated in FIG. 7 and the termination circuit 20B illustrated in FIG. 8.

The termination circuit 20A (FIG. 7) includes a resistor R3. One end of the resistor R3 is coupled to the signal terminal T, the negative logical AND circuit ND1, and the negative logical OR circuit NR1, and another end is coupled to the drains of the transistors MP1 and MN2. Hence, in this example, the transistor MP1 and the resistor R3 are provided in the path that couples the signal terminal T and the power supply node of the power supply voltage VDD. Similarly, the transistor MN2 and the resistor R3 are provided in the path that couples the signal terminal T and the ground node. The sum of the impedance between the drain and source of the transistor MP1 and the resistance of the resistor R3 in a case where the transistor MP1 is in the on state is set to a value, for example, approximately equal to the characteristic impedance of the signal wiring 12. The sum of the impedance between the drain and source of the transistor MN2 and the resistance of the resistor R3 in a case where the transistor MN2 is in the on state is set, for example, to a value approximately equal to the characteristic impedance of the signal wiring 12.

The termination circuit 20B (FIG. 8) includes resistors R1 and R2. One end of the resistor R1 is coupled to the power supply node of the power supply voltage VDD, and another end is coupled to the source of the transistor MP1. One end of the resistor R2 is coupled to the source of the transistor MN2, and another end is coupled to the ground node. Hence, in this example, the transistor MP1 and the resistor R1 are provided in the path that couples the signal terminal T and the power supply node of the power supply voltage VDD. Similarly, the transistor MN2 and the resistor R2 are provided in the path that couples the signal terminal T and the ground node. The sum of the impedance between the drain and source of the transistor MP1 and the resistance of the resistor R1 in a case where the transistor MP1 is in the on state is set, for example, to a value approximately equal to the characteristic impedance of the signal wiring 12. The sum of the impedance between the drain and source of the transistor MN2 and the resistance of the resistor R2 in a case where the transistor MN2 is in the on state is set, for example, to a value approximately equal to the characteristic impedance of the signal wiring 12.

Modification 1-2

Although one delay circuit 22 is provided in the aforementioned embodiment, this is not necessarily the case. Alternatively, two delay circuits, for example, may be provided as in the termination circuit 20C illustrated in FIG. 9. This termination circuit 20C includes a control circuit 21C. The control circuit 21C includes delay circuits 22 and 23. Similarly to the delay circuit 22, the delay circuit 23 is configured to delay the signal SIG and invert the signal SIG to generate the signal SIG2. The delay circuit 23 includes inverters IV4 to IV6. The negative logical AND circuit ND1 determines the negative logical AND of signals SIG and SIG1 and outputs the obtained result as a signal E1. The negative logical OR circuit NR1 determines the negative logical OR of signals SIG and SIG2 and outputs the obtained result as a signal E2. The delay circuit 22 corresponds to one specific example of a "first delay circuit" of one embodiment of the present disclosure. The delay circuit 23 corresponds to one specific example of a "second delay circuit" of one embodiment of the present disclosure. With this configuration, the termination circuit 20C makes it possible, for example, to set the delay amount in the delay circuit 22 to a value suitable for operation based on a rising edge of the signal SIG, and set the delay amount in the delay circuit 23 to a value suitable for operation based on a falling edge of the signal SIG.

Modification 1-3

Although in the aforementioned embodiment, dynamic termination operation is consistently performed, this is not necessarily the case. Alternatively, for example, as in the termination circuit 20D illustrated in FIG. 10, dynamic termination operation may be performed in a case where the enable signal EN is active, and dynamic termination operation may not be performed in a case where the enable signal EN is inactive. This termination circuit 20D will be described in detail below.

The termination circuit 20D includes a control terminal TEN, a control circuit 21D, and transistors MP1 and MN2. The control circuit 21D includes an inverter IV9, a delay circuit 22D, a negative logical AND circuit ND1, and a negative logical OR circuit NR1.

The control terminal TEN is a terminal to which the enable signal EN is supplied. The termination circuit 20D is designed to perform dynamic termination operation in a case where this enable signal EN is at a low level (active) and not perform dynamic termination operation in a case where the enable signal EN is at a high level (inactive).

The inverter IV9 is configured to invert the enable signal EN and output the inverted signal.

The delay circuit 22D includes a negative logical OR circuit NR2, inverters IV11 to IV14, and a negative logical AND circuit ND2. The negative logical OR circuit NR2 is configured to determine the negative logical OR of the enable signal EN and the signal SIG and output the obtained result. The inverter IV11 is configured to invert the output signal of the negative logical OR circuit NR2 and output the inverted signal. The inverter IV12 is configured to invert the output signal of the inverter IV11 and output the inverted signal. The inverter IV13 is configured to invert the output signal of the inverter IV12 and output the inverted signal. The inverter IV14 is configured to invert the output signal of the inverter IV13 and output the inverted signal as a signal SIG1A. The negative logical AND circuit ND2 is configured to determine the negative logical AND of the output signal of the inverter IV13 and the output signal of the inverter IV9, and to output the obtained result as a signal SIG1B.

Here, the enable signal EN corresponds to one specific example of a "control signal" of one embodiment of the present disclosure. The delay circuit 22D corresponds to one specific example of a "delay circuit" of one embodiment of the present disclosure.

In a case where the enable signal EN is at a low level (active), the negative logical OR circuit NR2 outputs the inverted signal of the signal SIG, and the negative logical AND circuit ND2 outputs the inverted signal of the output signal of the inverter IV13. Accordingly, each of the signals SIG1A and SIG1B is the delayed and inverted signal of the signal SIG. Thus, in a case where the enable signal EN is at a low level, the delay circuit 22D generates the signals SIG1A and SIG1B by operating on the basis of the signal SIG similarly to the delay circuit 22 of the aforementioned embodiment. As a result, the termination circuit 20D performs dynamic termination operation as in the aforementioned embodiment.

In a case where the enable signal EN is at a high level (inactive), the negative logical OR circuit NR2 outputs a low level signal and the negative logical AND circuit ND2 outputs a high level signal. In this case, the signal SIG1A is maintained at a low level and the signal SIG1B is maintained at a high level. Accordingly, the signal E1 is maintained at a high level and the signal E2 is maintained at a low level. As a result, the transistors MP1 and MN2 are maintained in the off state. Thus, the termination circuit 20D does not perform dynamic termination operation.

In this way, it is possible for the termination circuit 20D to perform dynamic termination operation or not perform dynamic termination operation on the basis of the enable signal EN. In addition, the termination circuit 20D is provided with the negative logical OR circuit NR2 in the stage preceding the inverters IV11 to IV14. This makes it possible to reduce power consumption in the termination circuit 20D because in a case where the enable signal EN is at a high level (inactive), the output signal of the negative logical OR circuit NR2 is fixed at a low level, which keeps the inverters IV11 to IV4 from operating.

Other Modifications

Two or more of these modifications may be used in combination.

2. Second Embodiment

An electronic circuit 2 according to the second embodiment will now be described. This embodiment is an application of the present technology to a signal wiring that carries differential signals. Note that the substantially same components as the components in the electronic circuit 1 of the first embodiment above are each denoted by the same reference numeral as the corresponding component in the electronic circuit 1 of the first embodiment above, and their explanation will be omitted as appropriate.

FIG. 11 illustrates an example configuration of the electronic circuit 2 according to this embodiment. The electronic circuit 2 includes a driver 31, a signal wiring 32, a receiver 33, and a termination circuit 40.

The driver 31 is configured to drive the signal wiring 32 on the basis of a signal supplied from the preceding circuit.

In this example, the driver 31 is designed to transmit a differential signal containing two signals. The signal wiring 32 is a wiring that carries the differential signal transmitted from the driver 31. The signal wiring 32 includes signal wirings 32T and 32B. The receiver 33 is configured to receive a signal SIG which is a differential signal transmitted from the driver 31 via the signal wiring 32. The signal SIG includes signals SIGT and SIGB. The termination circuit 40 is configured to terminate the signal wiring 32. The signals SIGT and SIGB are supposed to be respectively supplied to the signal terminals TT and TB of the termination circuit 40.

FIG. 12 illustrates an example configuration of the termination circuit 40. The termination circuit 40 includes a control circuit 41 and transistors MP11 to MP14 and MN11 to MN14. The transistors MP11 to MP14 are p-type MOS transistors, whereas the transistors MN11 to MN14 are n-type MOS transistors.

The control circuit 41 is configured to generate the signals SIGT1 and SIGB1 on the basis of the signal SIGT input to the signal terminal TT and the signal SIGB input to the signal terminal TB. The control circuit 41 includes delay circuits 42 and 43.

The delay circuit 42 is configured to delay the signal SIGT to generate the signal SIGT1. The delay circuit 42 includes inverters IV21 to IV24. The inverter IV21 is configured to invert the signal SIGT and output the inverted signal. The inverter IV22 is configured to invert the output signal of the inverter IV21 and output the inverted signal. The inverter IV23 is configured to invert the output signal of the inverter IV22 and output the inverted signal. The inverter IV24 is configured to invert the output signal of the inverter IV23 and output the inverted signal as the signal SIGT1.

The delay circuit 43 is configured to delay the signal SIGB to generate the signal SIGB1. The delay circuit 43 includes inverters IV25 to IV28. The configuration of the delay circuit 43 is similar to that of the delay circuit 42.

The transistor MP11 has a gate supplied with the signal SIGT1, a source coupled to the power supply node of the power supply voltage VDD, and a drain coupled to the source of the transistor MP12. The transistor MP12 has a gate supplied with the signal SIGB, a source coupled to the drain of the transistor MP11, and a drain coupled to the signal terminal TT. The impedance between the signal terminal TT and the power supply node in a case where the transistors MP11 and MP12 are in the on state is set to, for example, a value approximately equal to the characteristic impedance of the signal wiring 32T.

The transistor MN11 has a gate supplied with the signal SIGT1, a drain coupled to the source of the transistor MN12, and a source coupled to the ground node. The transistor MN12 has a gate supplied with the signal SIGB, a drain coupled to the signal terminal TT, and a source coupled to the drain of the transistor MN11. The impedance between the signal terminal TT and the ground node in a case where the transistors MN11 and MN12 are in the on state is set to, for example, a value approximately equal to the characteristic impedance of the signal wiring 32T.

The transistor MP13 has a gate supplied with the signal SIGB1, a source coupled to the power supply node of the power supply voltage VDD, and a drain coupled to the source of the transistor MP14. The transistor MP14 has a gate supplied with the signal SIGT, a source coupled to the drain of the transistor MP13, and a drain coupled to the signal terminal TB. The impedance between the signal terminal TB and the power supply node in a case where the transistors MP13 and MP14 are in the on state is set to, for example, a value approximately equal to the characteristic impedance of the signal wiring 32B.

The transistor MN13 has a gate supplied with the signal SIGB1, a drain coupled to the source of the transistor MN14, and a source coupled to the ground node. The transistor MN14 has a gate supplied with the signal SIGT, a drain coupled to the signal terminal TB, and a source coupled to the drain of the transistor MN13. The impedance between the signal terminal TB and the ground node in a case where the transistors MN13 and MN14 are in the on state is set to, for example, a value approximately equal to the characteristic impedance of the signal wiring 32B.

Here, the signal terminal TT corresponds to one specific example of a "first input terminal" of one embodiment of the present disclosure. The signal terminal TB corresponds to one specific example of a "second input terminal" of one embodiment of the present disclosure. The transistor MP11 corresponds to one specific example of a "third transistor" of one embodiment of the present disclosure. The transistor MP12 corresponds to one specific example of a "fourth transistor" of one embodiment of the present disclosure. The transistor MN11 corresponds to one specific example of a "fifth transistor" of one embodiment of the present disclosure. The transistor MN12 corresponds to one specific example of a "sixth transistor" of one embodiment of the present disclosure. The transistor MP13 corresponds to one specific example of a "seventh transistor" of one embodiment of the present disclosure. The transistor MP14 corresponds to one specific example of an "eighth transistor" of one embodiment of the present disclosure. The transistor MN13 corresponds to one specific example of a "ninth transistor" of one embodiment of the present disclosure. The transistor MN14 corresponds to one specific example of a "tenth transistor" of one embodiment of the present disclosure. The control circuit 41 corresponds to one specific example of a "control circuit" of one embodiment of the present disclosure. The signal SIGT corresponds to one specific example of a "first input signal" of one embodiment of the present disclosure. The signal SIGB corresponds to one specific example of a "second input signal" of one embodiment of the present disclosure. The delay circuit 42 corresponds to one specific example of a "third delay circuit" of one embodiment of the present disclosure. The delay circuit 43 corresponds to one specific example of a "fourth delay circuit" of one embodiment of the present disclosure.

FIG. 13 illustrates an example of the operation of the termination circuit 40. (A) illustrates the waveform of the signal SIGT, (B) illustrates the waveform of the signal SIGB, (C) illustrates the waveform of the signal SIGT1, (D) illustrates the waveform of the signal SIGB1, (E) illustrates the waveform of the current IchgT flowing from the transistor MP11 to the transistor MP12, (F) illustrates the waveform of the current IdischgT flowing from the transistor MN12 to the transistor MN11, (G) illustrates the waveform of the current IchgB flowing from the transistor MP13 to the transistor MP14, and (H) illustrates the waveform of the current IdischgB flowing from the transistor MN14 to the transistor MN13.

First, the rising edge of the signal SIGT will be explained. The delay circuit 42 delays the signal SIGT to generate the signal SIGT1 (FIGS. 13(A) and (C)). Since the signals SIGT and SIGB constitute a differential signal, when the signal SIGT rises, the signal SIGB falls (FIG. 13(B)). The transistor MP12 changes from the off state to the on state at the time when the signal SIGB falls. The transistor MP11 changes from the on state to the off state at the time when the signal SIGT1 rises. Accordingly, during the period P11 from the time when the signal SIGB falls to the time when the signal SIGT1 rises, both the transistors MP11 and MP12 are in the on state. In other words, this period P11 is the period from the time when the signal SIGT rises to the time when the signal SIGT1 rises. This causes a current IchgT to flow from the transistor MP11 toward the transistor MP12 during the period P11 corresponding to a rising edge of the signal SIGT (FIG. 13(E)). This current IchgT causes the voltage of the signal SIGT to rise more quickly toward a high level. In other words, the termination circuit 40 assists the voltage of the signal SIGT to rise.

Next, the falling edge of the signal SIGT will be explained. Since the signals SIGT and SIGB constitute a differential signal, when the signal SIGT falls, the signal SIGB rises (FIG. 13(B)). The transistor MN12 changes from the off state to the on state at the time when the signal SIGB rises. The transistor MN1 changes from the on state to the off state at the time when the signal SIGT1 falls. Accordingly, during the period P12 from the time when the signal SIGB rises to the time when the signal SIGT1 falls, both the transistors MN11 and MN12 are in the on state. In other words, this period P12 is the period from the time when the signal SIGT falls to the time when the signal SIGT1 falls. This causes the current IdischgT to flow from the transistor MN12 to the transistor MN11 during the period P12 corresponding to a falling edge of the signal SIGT (FIG. 13(F)). This current IdischgT causes the voltage of the signal SIGT to decrease more quickly toward a low level. In other words, the termination circuit 40 assists the voltage of the signal SIGT to decrease.

In this way, in the termination circuit 40, during the period P11 corresponding to a rising edge of the signal SIGT, both the transistors MP11 and MP12 are transiently brought into the on state, and during the period P12 corresponding to a falling edge of the signal SIGT, both the transistors MN1 and MN12 are transiently brought into the on state. This causes the signal wiring 32T to be transiently terminated during the periods P1 and P12 when the signal SIGT changes. To be specific, during the period P11, the termination path that couples the signal terminal TT and the power supply node of the power supply voltage VDD is enabled, and during the period P12, the termination path that couples the signal terminal TT and the ground node is enabled. In other words, dynamic termination operation is performed in the termination circuit 40.

Next, the rising edge of the signal SIGB will be explained. The delay circuit 43 delays the signal SIGB to generate the signal SIGB1 (FIGS. 13(B) and (D)). Since the signals SIGT and SIGB constitute a differential signal, when the signal SIGB rises, the signal SIGT falls (FIG. 13(A)). The transistor MP14 changes from the off state to the on state at the time when the signal SIGT falls. The transistor MP13 changes from the on state to the off state at the time when the signal SIGB1 rises. Accordingly, during the period P21 from the time when the signal SIGT falls to the time when the signal SIGB1 rises, both the transistors MP13 and MP14 are in the on state. In other words, this period P21 is the period from the time when the signal SIGB rises to the time when the signal SIGB1 rises. This causes the current IchgB to flow from the transistor MP13 to the transistor MP14 during the period P21 corresponding to a rising edge of the signal SIGB (FIG. 13(G)). This current IchgB causes the voltage of the signal SIGB to rise more quickly toward a high level. In other words, the termination circuit 40 assists the voltage of the signal SIGB to rise.

Next, the falling edge of the signal SIGB will be explained. Since the signals SIGT and SIGB constitute a differential signal, when the signal SIGB falls, the signal SIGT rises (FIG. 13(A)). The transistor MN14 changes from the off state to the on state at the time when the signal SIGT falls. The transistor MN13 changes from the on state to the off state at the time when the signal SIGB1 falls. Accordingly, during the period P22 from the time when the signal SIGT rises to the time when the signal SIGB1 falls, both the transistors MN13 and MN14 are in the on state. In other words, this period P22 is the period from the time when the signal SIGB falls to the time when the signal SIGB1 falls. This causes the current IdigchgB to flow from the transistor MN14 to the transistor MN13 during the period P22 corresponding to a falling edge of the signal SIGB (FIG. 13(F)). This current IdischgB causes the voltage of the signal SIGB to decrease more quickly toward a low level. In other words, the termination circuit 40 assists the voltage of the signal SIGB to decrease.

In this way, in the termination circuit 40, during the period P21 corresponding to a rising edge of the signal SIGB, both the transistors MP13 and MP14 are transiently brought into the on state, and during the period P22 corresponding to a falling edge of the signal SIGB, both the transistors MN13 and MN14 are transiently brought into the on state. This causes the signal wiring 32B to be transiently terminated during the periods P21 and P22 when the signal SIGB changes. To be specific, during the period P21, the termination path that couples the signal terminal TB and the power supply node of the power supply voltage VDD is enabled, and during the period P22, the termination path that couples the signal terminal TB and the ground node is enabled. In other words, dynamic termination operation is performed in the termination circuit 40.

Thus, in the termination circuit 40, provided are a first circuit (transistors MP11 and MP12) that is provided in the first path that couples the signal terminal TT and the power supply node of the power supply voltage VDD and is configured to enable the first path, a second circuit (transistors MN11 and MN12) that is provided in the second path that couples the signal terminal TT and the ground node and is configured to enable the second path, a third circuit (transistors MP13 and MP14) that is provided in the third path that couples the signal terminal TB and the power supply node of the power supply voltage VDD and is configured to enable the third path, and a fourth circuit (transistors MN13 and MN14) that is provided in the fourth path that couples the signal terminal TB and the ground node and is configured to enable the fourth path. Further, the termination circuit 40 is provided with a control circuit 41 that controls the operation of the first circuit (transistors MP11 and MP12) to enable the first path during the first period (period P11) corresponding to a rising edge of the signal SIGT at the signal terminal TT, the operation of the second circuit (transistors MN11 and MN12) to enable the second path during the second period (period P12) corresponding to a falling edge of the signal SIGT, the operation of the third circuit (transistors MP13 and MP14) to enable the third path during the third period (period P21) corresponding to a rising edge of the signal SIGB at the signal terminal TB, and the operation of the fourth circuit (transistors MN13 and MN14) to enable the fourth path during the fourth period (period P22) corresponding to a falling edge of the signal SIGB. In addition, the transistors MP11 and MP12 are coupled in series in the first path, the transistors MN11 and MN12 are coupled in series in the second path, the transistors MP13 and MP14 are coupled in series in the third path, and the transistors MN13 and MN14 are coupled in series in the fourth path. This allows the termination circuit 40 to perform dynamic termination operation, making it possible to suppress reflections and suppress ringing in the electronic circuit 2. Further, it is possible to shorten the rise time tr and fall time tf of the signals SIGT and SIGB. This makes it possible to increase the waveform quality of the signals SIGT and SIGB in the termination circuit 40.

Modification 2-1

Although in the aforementioned embodiment, dynamic termination operation is consistently performed, this is not necessarily the case. Alternatively, for example, as in the termination circuit 40A illustrated in FIG. 14, dynamic termination operation may be performed in a case where the enable signal EN is active and may not be performed in a case where the enable signal EN is inactive. This termination circuit 40A will be described in detail below.

The termination circuit 40A includes a control terminal TEN, a control circuit 41A, and transistors MP11 to MP14 and MN11 to MN14. The control circuit 41A includes delay circuits 42A and 43A.

The control terminal TEN is a terminal to which the enable signal EN is supplied. The termination circuit 40A is designed to perform dynamic termination operation in a case where this enable signal EN is at a low level (active) and not perform dynamic termination operation in a case where the enable signal EN is at a high level (inactive).

The delay circuit 42A includes a negative logical OR circuit NR3, inverters IV31 to IV33, and a negative logical OR circuit NR4. The negative logical OR circuit NR3 is configured to determine the negative logical OR of the enable signal EN and the signal SIGT and output the obtained result. The inverter IV31 is configured to invert the output signal of the negative logical OR circuit NR3 and output the inverted signal. The inverter IV32 is configured to invert the output signal of inverter IV31 and output the inverted signal. The inverter IV33 is configured to invert the output signal of the inverter IV32 and output the inverted signal as a signal SIGT2. The negative logical OR circuit NR4 is configured to determine the negative logical OR of the output signal of the inverter IV32 and the enable signal EN, and to output the obtained result as a signal SIGT3.

The delay circuit 43A includes a negative logical OR circuit NR5, inverters IV34 to IV36, and a negative logical OR circuit NR6. The negative logical OR circuit NR5 is configured to determine the negative logical OR of the enable signal EN and the signal SIGB and output the obtained result. The inverter IV34 is configured to invert the output signal of the negative logical OR circuit NR5 and output the inverted signal. The inverter IV35 is configured to invert the output signal of the inverter IV34 and output the inverted signal. The inverter IV36 is configured to invert the output signal of the inverter IV35 and output the inverted signal as a signal SIGB2. The negative logical OR circuit NR6 is configured to determine the negative logical OR of the output signal of the inverter IV35 and the enable signal EN, and to output the obtained result as a signal SIGB3.

Here, the enable signal EN corresponds to one specific example of a "control signal" of one embodiment of the present disclosure. The delay circuit 42A corresponds to one specific example of a "third delay circuit" of one embodiment of the present disclosure. The delay circuit 43A corresponds to one specific example of a "fourth delay circuit" of one embodiment of the present disclosure.

In a case where the enable signal EN is at a low level (active), the negative logical OR circuit NR3 outputs the inverted signal of the signal SIGT, and the negative logical OR circuit NR4 outputs the inverted signal of the output signal of the inverter IV32. This means that each of the signals SIGT2 and SIGT3 is a signal obtained by delaying the signal SIGT. Thus, in a case where the enable signal EN is at a low level, the delay circuit 42A generates the signals SIGT2 and SIGT3 on the basis of the signal SIG by operating similarly to the delay circuit 42 according to the aforementioned embodiment. Similarly, in a case where the enable signal EN is at a low level, the negative logical OR circuit NR5 outputs the inverted signal of the signal SIGB, and the negative logical OR circuit NR6 outputs the inverted signal of the output signal of the inverter IV35. This means that each of the signals SIGB2 and SIGB3 is a signal obtained by delaying the signal SIGB. Thus, in a case where the enable signal EN is at a low level, the delay circuit 43A generates the signals SIGB2 and SIGB3 on the basis of the signal SIG by operating similarly to the delay circuit 43 according to the aforementioned embodiment. This causes the termination circuit 40A to perform dynamic termination operation as in the aforementioned embodiment.

In a case where the enable signal EN is at a high level (inactive), each of the negative logical OR circuits NR3 to NR6 outputs a low-level signal. In this case, the signals SIGT2 and SIGB2 are maintained at a high level, and the signals SIGT3 and SIGB3 are maintained at a low level. Consequently, the transistors MP11, MP13, MN11, and MN13 are maintained in the off state. Thus, the termination circuit 40A does not perform dynamic termination operation.

Modification 2-2

Although in the aforementioned embodiment, the signal SIGT1 is supplied to the gates of the transistors MP11 and MN11, the signal SIGB is supplied to the gates of the transistors MP12 and MN12, the signal SIGB1 is supplied to the gates of the transistors MP13 and MN13, and the signal SIGT is supplied to the gates of the transistors MP14 and MN14, this is not necessarily the case. Alternatively, as in the termination circuit 40B illustrated in FIG. 15, the signal SIGT1 may be supplied to the gates of the transistors MP12 and MN12, the signal SIGB may be supplied to the gates of the transistors MP11 and MN11, the signal SIGB1 may be supplied to the gates of the transistors MP14 and MN14, and the signal SIGT may be supplied to the gates of the transistors MP13 and MN13. Here, the transistor MP12 corresponds to one specific example of a "third transistor" of one embodiment of the present disclosure. The transistor MP11 corresponds to one specific example of a "fourth transistor" of one embodiment of the present disclosure. The transistor MN12 corresponds to one specific example of a "fifth transistor" of one embodiment of the present disclosure. The transistor MN11 corresponds to one specific example of a "sixth transistor" of one embodiment of the present disclosure. The transistor MP14 corresponds to one specific example of a "seventh transistor" of one embodiment of the present disclosure. The transistor MP13 corresponds to one specific example of an "eighth transistor" of one embodiment of the present disclosure. The transistor MN14 corresponds to one specific example of a "ninth transistor" of one embodiment of the present disclosure. The transistor MN13 corresponds to one specific example of a "tenth transistor" of one embodiment of the present disclosure.

Other Modifications

Two or more of these variations may also be combined. Further, the modifications 1-1 and 1-2 of the first embodiment may also be applied to the electronic circuit 2 of the second embodiment.

3. Examples of Application

Examples of applications of the termination circuits 20 and 40 described in the aforementioned embodiments and modifications will now be explained. Note that although examples of applications of the termination circuit 20 which is based on single-phase signals will be described below, the same applies to examples of applications of the termination circuit 40 which is based on differential signals.

First Example of Application

FIG. 16 illustrates an example of application of the termination circuit 20. In this example, the termination circuit 20 is applied to communication between a semiconductor chip 51 and a semiconductor chip 52. The driver 11 is provided in the semiconductor chip 51, and the receiver 13 and the termination circuit 20 are provided in the semiconductor chip 52. The signal wiring 12 may be, for example, a transmission line formed on a printed circuit board (PCB) or a cable.

Second Example of Application

FIG. 17 illustrates another example of application of the termination circuit 20. In this example, the termination circuit 20 is applied to communication in the semiconductor chip 53. The driver 11, signal wiring 12, receiver 13, and termination circuit 20 are provided in the semiconductor chip 53.

FIG. 18 illustrates an example of the signal wiring 12 in the semiconductor chip 53. In this example, the semiconductor chip 53 has four wiring layers LM (wiring layers LM1 to LM4). The wiring layer LM1, wiring layer LM2, wiring layer LM3, and wiring layer LM4 are formed on a semiconductor substrate 50 in this order, with an insulating layer in between. The driver 11, receiver 13, and termination circuit 20 are formed in the semiconductor substrate 50. In this example, the signal wiring 12 includes metal wiring formed in the wiring layer LM4, a connection 91 coupling an end of the metal wiring and the driver 11 formed in the semiconductor substrate 50, and a connection 92 coupling an end of the metal wiring and the receiver 13 and the termination circuit 20 formed in the semiconductor substrate 50. The connections 91 and 92 each include metal wiring, a contact, and a via.

For example, in a case where the metal wiring in the signal wiring 12 is long or many load circuits are coupled to this signal wiring 12, the rise time tr and fall time tf of the signal SIG in this signal wiring 12 may become long. Even in this case, use of the termination circuit 20 enables dynamic termination, which makes it possible, for example, to shorten the rise time tr and fall time tf of the signal SIG.

Third Example of Application

Figure 19:
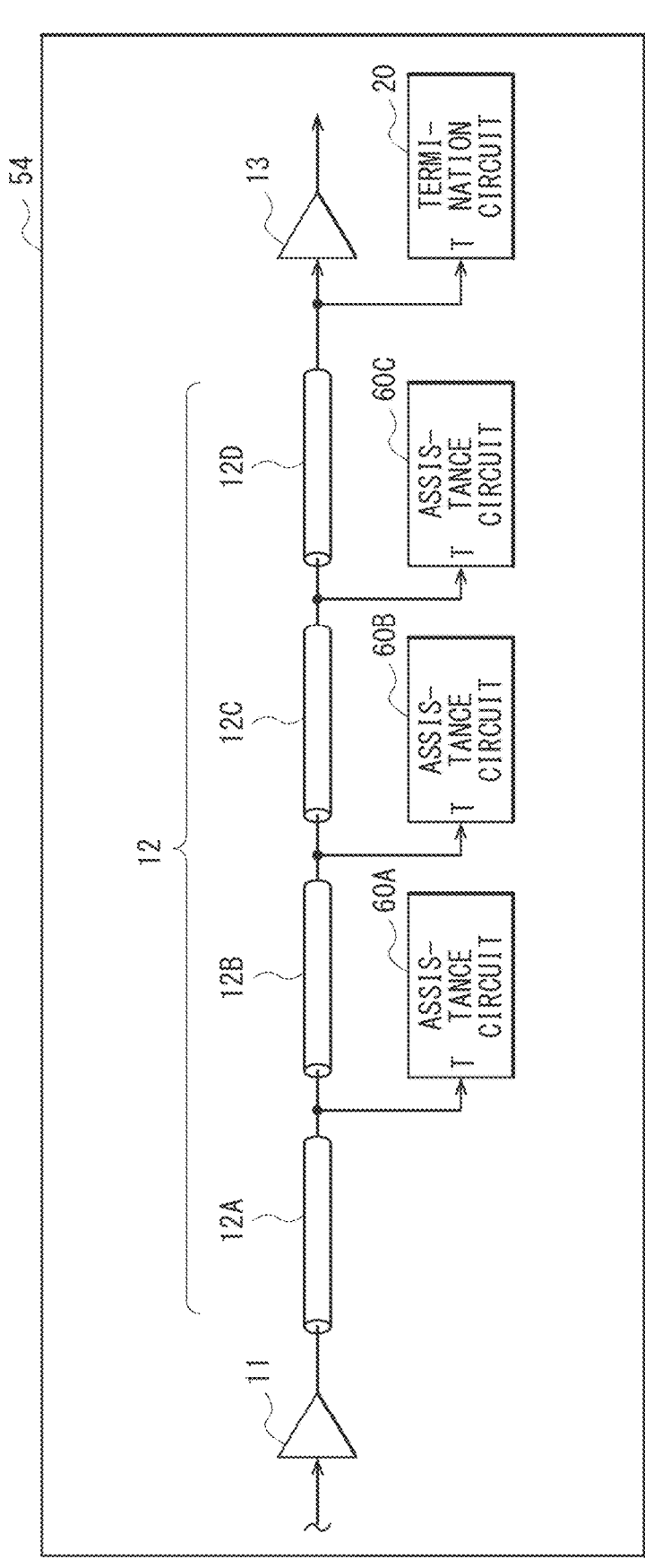
FIG. 19 is a block diagram illustrating an example configuration of an electronic circuit according to still another example of application.

FIG. 19 illustrates another example of application of the termination circuit 20. In this example, in addition to the driver 11, signal wiring 12, receiver 13, and termination circuit 20, three assistance circuits 60 (assistance circuits 60A to 60C) are provided in the semiconductor chip 54 in this example. The signal wiring 12 is divided into four wiring sections (signal wiring 12A to 12D) in this example. The assistance circuit 60A is coupled between the signal wiring 12A and the signal wiring 12B, the assistance circuit 60B is coupled between the signal wiring 12B and the signal wiring 12C, and the assistance circuit 60C is coupled between the signal wiring 12C and the signal wiring 12D. The assistance circuits 60 have the same circuit configuration as the termination circuit 20. The assistance circuits 60 each make it possible to shorten the rise time tr and fall time tf of the signal.

Figure 20:
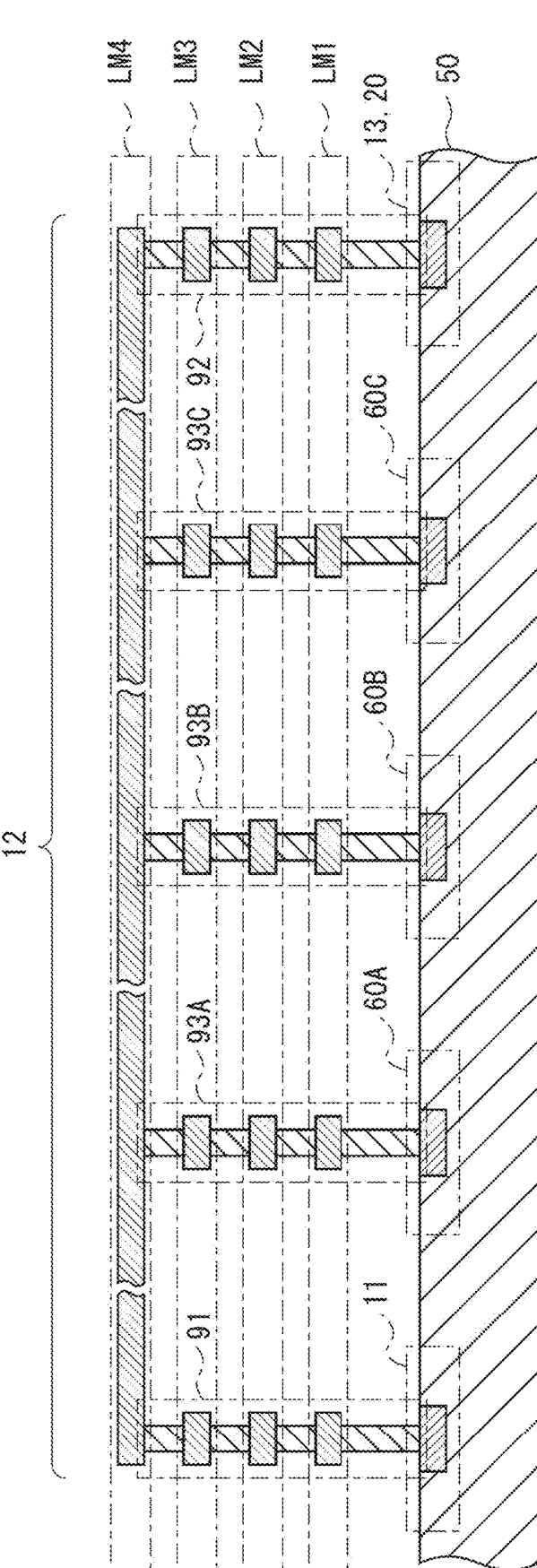
FIG. 20 is a structural diagram illustrating an example configuration of the signal wiring illustrated in FIG. 17.

FIG. 20 illustrates an example of the signal wiring 12 in the semiconductor chip 54. In this example, the driver 11, assistance circuits 60A to 60C, receiver 13, and termination circuit 20 are formed on the semiconductor substrate 50. In this example, the metal wiring of the signal wiring 12 is coupled to the assistance circuit 60A via the connection 93A, to the assistance circuit 60B via the connection 93B, and to the assistance circuit 60C via the connection 93C.

In general, in a case where the signal wiring 12 is long, antenna cells need to be coupled via the connections 93A to 93C illustrated in FIG. 20, to satisfy the so-called antenna rule. It is also possible to use the assistance circuits 60A to 60C in place of these antenna cells.

Figure 21:
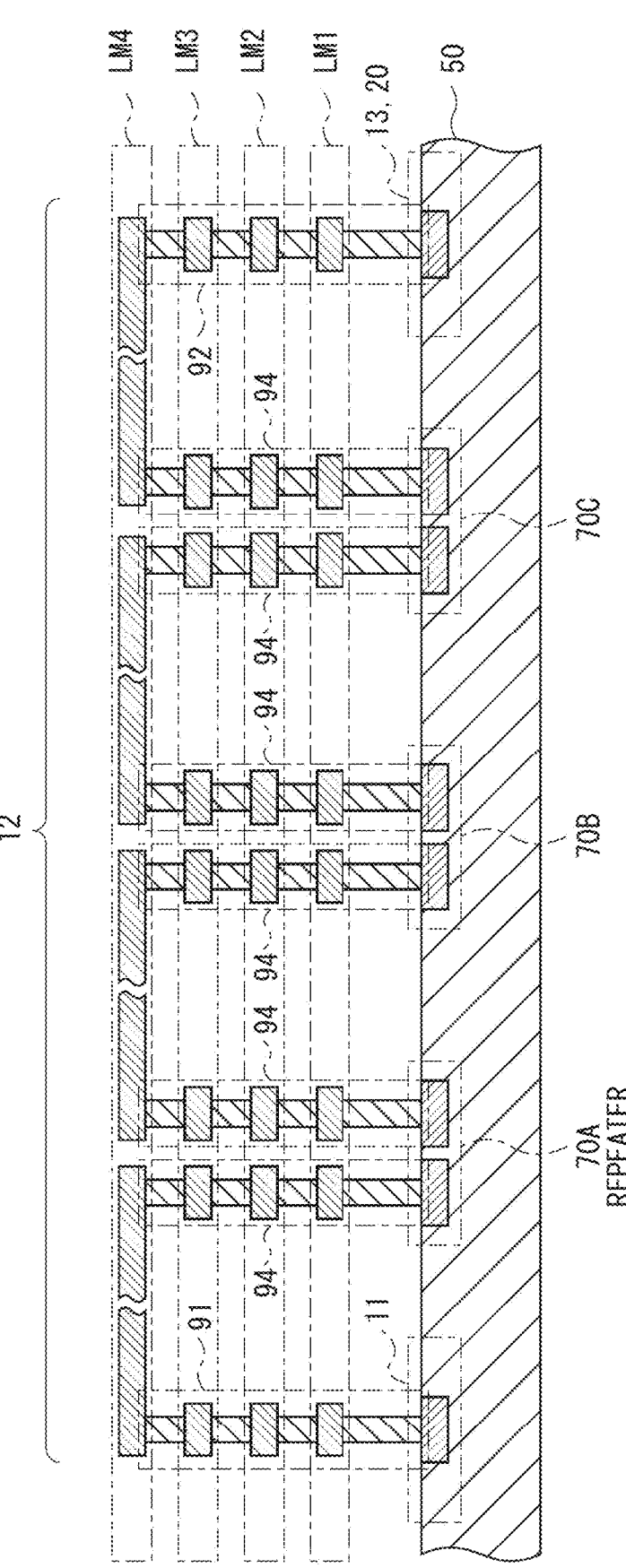
FIG. 21 is a structural diagram illustrating an example configuration of signal wiring according to a reference example.

As described above, in a case where the signal wiring 12 is long, providing the assistance circuits 60 makes it possible to increase the waveform quality of the signals. This allows, as illustrated in FIG. 21, for example, the number of connections to be reduced from a case where a plurality of repeaters 70 (three repeaters 70A to 70C in this example) are provided, thereby making it possible to reduce the wiring resistance of the signal wiring 12.

Although the present technology has been described above taking some embodiments and modifications and examples of applications thereof, the present technology is not limited to these embodiments and the like and it is possible to make various modifications.

For example, the number of stages of delay circuit in each of the aforementioned embodiments is merely illustrative and may be changed as needed.

Note that the effects described herein are merely illustrative and are not limited, and there may be other effects as well.

Note that it is possible for the present technology to be configured as follows. The present technology with the following configuration makes it possible to increase the waveform quality of signals.

(1)

A termination circuit including:

a first circuit provided in a first path that couples a first signal terminal and a first power supply node, the first circuit being configured to enable the first path;

a second circuit provided in a second path that couples the first signal terminal and a second power supply node, the second circuit being configured to enable the second path; and a control circuit that is configured to perform a first operation including controlling an operation of the first circuit to enable the first path during a first period that corresponds to a rising edge of a first input signal at the first signal terminal, and controlling an operation of the second circuit to enable the second path during a second period that corresponds to a falling edge of the first input signal.

(2)

The termination circuit according to (1), in which the first circuit includes a first transistor having a gate, a source, and a drain, the source being led to the first power supply node, the drain being led to the first signal terminal, the second circuit includes a second transistor having a gate, a source, and a drain, the source being led to the second power supply node, the drain being led to the first signal terminal, and the first operation includes generating a first signal by detecting the rising edge of the first input signal, and supplying the first signal to the gate of the first transistor, and generating a second signal by detecting the falling edge of the first input signal and supplying the second signal to the gate of the second transistor.

(3)

The termination circuit according to (2), in which the control circuit includes a delay circuit that is configured to generate an inverted signal by delaying the first input signal and inverting the first input signal, and the first operation includes generating the first signal and the second signal on the basis of the first input signal and the inverted signal.

(4)

The termination circuit according to (2), in which the control circuit includes a first delay circuit that is configured to generate a first inverted signal by delaying the first input signal and inverting the first input signal, and a second delay circuit that is configured to generate a second inverted signal by delaying the first input signal and inverting the first input signal, and the first operation includes generating the first signal on the basis of the first input signal and the first inverted signal, and generating the second signal on the basis of the first input signal and the second inverted signal.

(5)

The termination circuit according to any one of (2) to (4), in which the control circuit is configured to perform the first operation in a case where a control signal is at a first logic level, and perform a second operation in a case where the control signal is at a second logic level, the second operation including controlling the operation of the first circuit to maintain the first path disabled, and controlling the operation of the second circuit to maintain the second path disabled.

(6)

The termination circuit according to (1), further including:

a third circuit provided in a third path that couples a second signal terminal and the first power supply node, the third circuit being configured to enable the third path; and a fourth circuit provided in a fourth path that couples the second signal terminal and the second power supply node, the fourth circuit being configured to enable the fourth path, in which the first operation includes controlling an operation of the third circuit to enable the third path during a third period that corresponds to a rising edge of a second input signal at the second signal terminal, and controlling an operation of the fourth circuit to enable the fourth path during a fourth period that corresponds to a falling edge of the second input signal.

(7)

The termination circuit according to (6), in which the first input signal and the second input signal constitute a differential signal, the first circuit includes a third transistor having a gate, a source, and a drain, and a fourth transistor having a gate, a source, and a drain, the gate being coupled to the second signal terminal, the third transistor and the fourth transistor are coupled in series in the first path, the second circuit includes a fifth transistor having a gate, a source, and a drain, and a sixth transistor having a gate, a source, and a drain, the gate being coupled to the second signal terminal, the fifth transistor and the sixth transistor are coupled in series in the second path, the third circuit includes a seventh transistor having a gate, a source, and a drain, and an eighth transistor having a gate, a source, and a drain, the gate being coupled to the first signal terminal, the seventh transistor and the eighth transistor are coupled in series in the third path, the fourth circuit includes a ninth transistor having a gate, a source, and a drain, and a tenth transistor having a gate, a source, and a drain, the gate being coupled to the first signal terminal, the ninth transistor and the tenth transistor are coupled in series in the fourth path, the control circuit includes a third delay circuit that is configured to delay the first input signal, and a fourth delay circuit that is configured to delay the second input signal, and the first operation includes supplying the first input signal delayed by the third delay circuit to the gate of the third transistor and the gate of the fifth transistor, and supplying the second input signal delayed by the fourth delay circuit to the gate of the seventh transistor and the gate of the ninth transistor.

(8)

The termination circuit according to (6) or (7), in which the control circuit is configured to perform the first operation in a case where a control signal is at a first logic level, and perform a second operation in a case where the control signal is at a second logic level, the second operation including controlling the operation of the first circuit to maintain the first path disabled, controlling the operation of the second circuit to maintain the second path disabled, controlling the operation of the third circuit to maintain the third path disabled, and controlling the operation of the fourth circuit to maintain the fourth path disabled.

(9)

A semiconductor circuit including;

a signal wiring;

a first circuit provided in a first path that couples a first signal terminal and a first power supply node, the first signal terminal being coupled to the signal wiring, the first circuit being configured to enable the first path;

a second circuit provided in a second path that couples the first signal terminal and a second power supply node, the second circuit being configured to enable the second path; and a control circuit that is configured to perform a first operation including controlling an operation of the first circuit to enable the first path during a first period that corresponds to a rising edge of a first input signal at the first signal terminal, and controlling an operation of the second circuit to enable the second path during a second period that corresponds to a falling edge of the first input signal.

(10)

The semiconductor circuit according to (9), in which the first signal terminal is coupled to an end of the signal wiring.

(11) The semiconductor circuit according to (9), in which the first signal terminal is coupled to a part of the signal wiring other than an end of the signal wiring.

The present application claims the benefit of Japanese Priority Patent Application JP2022-002478 filed with the Japan Patent Office on Jan. 11, 2022, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A termination circuit comprising:

a first circuit provided in a first path that couples a first signal terminal and a first power supply node, the first circuit being configured to enable the first path;

a second circuit provided in a second path that couples the first signal terminal and a second power supply node, the second circuit being configured to enable the second path; and a control circuit that is configured to perform a first operation including controlling an operation of the first circuit to enable the first path during a first period that corresponds to a rising edge of a first input signal at the first signal terminal, and controlling an operation of the second circuit to enable the second path during a second period that corresponds to a falling edge of the first input signal, wherein the first circuit includes a first transistor having a gate, a source, and a drain, the source being led to the first power supply node, the drain being led to the first signal terminal, the second circuit includes a second transistor having a gate, a source, and a drain, the source being led to the second power supply node, the drain being led to the first signal terminal, and the first operation includes generating a first signal by detecting the rising edge of the first input signal, and supplying the first signal to the gate of the first transistor, and generating a second signal by detecting the falling edge of the first input signal and supplying the second signal to the gate of the second transistor, and wherein the control circuit includes a first delay circuit that is configured to generate a first inverted signal by delaying the first input signal and inverting the first input signal, and a second delay circuit that is configured to generate a second inverted signal by delaying the first input signal and inverting the first input signal, and wherein the first operation includes generating the first signal on a basis of the first input signal and the first inverted signal, and generating the second signal on a basis of the first input signal and the second inverted signal.

2. The termination circuit according to claim 1, wherein the control circuit includes a delay circuit that is configured to generate an inverted signal by delaying the first input signal and inverting the first input signal, and the first operation includes generating the first signal and the second signal on a basis of the first input signal and the inverted signal.

3. The termination circuit according to claim 1, wherein the control circuit is configured to perform the first operation in a case where a control signal is at a first logic level, and perform a second operation in a case where the control signal is at a second logic level, the second operation including controlling the operation of the first circuit to maintain the first path disabled, and controlling the operation of the second circuit to maintain the second path disabled.

4. The termination circuit according to claim 1, further comprising:

a third circuit provided in a third path that couples a second signal terminal and the first power supply node, the third circuit being configured to enable the third path; and a fourth circuit provided in a fourth path that couples the second signal terminal and the second power supply node, the fourth circuit being configured to enable the fourth path, wherein the first operation includes controlling an operation of the third circuit to enable the third path during a third period that corresponds to a rising edge of a second input signal at the second signal terminal, and controlling an operation of the fourth circuit to enable the fourth path during a fourth period that corresponds to a falling edge of the second input signal.

5. A termination circuit comprising:

a first circuit provided in a first path that couples a first signal terminal and a first power supply node, the first circuit being configured to enable the first path;

a second circuit provided in a second path that couples the first signal terminal and a second power supply node, the second circuit being configured to enable the second path;

a control circuit that is configured to perform a first operation including controlling an operation of the first circuit to enable the first path during a first period that corresponds to a rising edge of a first input signal at the first signal terminal, and controlling an operation of the second circuit to enable the second path during a second period that corresponds to a falling edge of the first input signal;

a third circuit provided in a third path that couples a second signal terminal and the first power supply node, the third circuit being configured to enable the third path; and a fourth circuit provided in a fourth path that couples the second signal terminal and the second power supply node, the fourth circuit being configured to enable the fourth path, wherein the first operation includes controlling an operation of the third circuit to enable the third path during a third period that corresponds to a rising edge of a second input signal at the second signal terminal, and controlling an operation of the fourth circuit to enable the fourth path during a fourth period that corresponds to a falling edge of the second input signal, wherein the first input signal and the second input signal constitute a differential signal, the first circuit includes a third transistor having a gate, a source, and a drain, and a fourth transistor having a gate, a source, and a drain, the gate being coupled to the second signal terminal, the third transistor and the fourth transistor are coupled in series in the first path, the second circuit includes a fifth transistor having a gate, a source, and a drain, and a sixth transistor having a gate, a source, and a drain, the gate being coupled to the second signal terminal, the fifth transistor and the sixth transistor are coupled in series in the second path, the third circuit includes a seventh transistor having a gate, a source, and a drain, and an eighth transistor having a gate, a source, and a drain, the gate being coupled to the first signal terminal, the seventh transistor and the eighth transistor are coupled in series in the third path, the fourth circuit includes a ninth transistor having a gate, a source, and a drain, and a tenth transistor having a gate, a source, and a drain, the gate being coupled to the first signal terminal, the ninth transistor and the tenth transistor are coupled in series in the fourth path, the control circuit includes a third delay circuit that is configured to delay the first input signal, and a fourth delay circuit that is configured to delay the second input signal, and the first operation includes supplying the first input signal delayed by the third delay circuit to the gate of the third transistor and the gate of the fifth transistor, and supplying the second input signal delayed by the fourth delay circuit to the gate of the seventh transistor and the gate of the ninth transistor.

6. The termination circuit according to claim 4, wherein the control circuit is configured to perform the first operation in a case where a control signal is at a first logic level, and perform a second operation in a case where the control signal is at a second logic level, the second operation including controlling the operation of the first circuit to maintain the first path disabled, controlling the operation of the second circuit to maintain the second path disabled, controlling the operation of the third circuit to maintain the third path disabled, and controlling the operation of the fourth circuit to maintain the fourth path disabled.

7. A semiconductor circuit comprising:

a signal wiring;

a first circuit provided in a first path that couples a first signal terminal and a first power supply node, the first signal terminal being coupled to the signal wiring, the first circuit being configured to enable the first path;

a second circuit provided in a second path that couples the first signal terminal and a second power supply node, the second circuit being configured to enable the second path; and a control circuit that is configured to perform a first operation including controlling an operation of the first circuit to enable the first path during a first period that corresponds to a rising edge of a first input signal at the first signal terminal, and controlling an operation of the second circuit to enable the second path during a second period that corresponds to a falling edge of the first input signal, wherein the first circuit includes a first transistor having a gate, a source, and a drain, the source being led to the first power supply node, the drain being led to the first signal terminal, the second circuit includes a second transistor having a gate, a source, and a drain, the source being led to the second power supply node, the drain being led to the first signal terminal, and the first operation includes generating a first signal by detecting the rising edge of the first input signal, and supplying the first signal to the gate of the first transistor, and generating a second signal by detecting the falling edge of the first input signal and supplying the second signal to the gate of the second transistor, and wherein the control circuit includes a first delay circuit that is configured to generate a first inverted signal by delaying the first input signal and inverting the first input signal, and a second delay circuit that is configured to generate a second inverted signal by delaying the first input signal and inverting the first input signal, and wherein the first operation includes generating the first signal on a basis of the first input signal and the first inverted signal, and generating the second signal on a basis of the first input signal and the second inverted signal.

8. The semiconductor circuit according to claim 7, wherein the first signal terminal is coupled to an end of the signal wiring.

9. The semiconductor circuit according to claim 7, wherein the first signal terminal is coupled to a part of the signal wiring other than an end of the signal wiring.

10. The semiconductor circuit according to claim 7, wherein the control circuit includes a delay circuit that is configured to generate an inverted signal by delaying the first input signal and inverting the first input signal, and the first operation includes generating the first signal and the second signal on a basis of the first input signal and the inverted signal.

11. The semiconductor circuit according to claim 7, wherein the control circuit is configured to perform the first operation in a case where a control signal is at a first logic level, and perform a second operation in a case where the control signal is at a second logic level, the second operation including controlling the operation of the first circuit to maintain the first path disabled, and controlling the operation of the second circuit to maintain the second path disabled.

12. The semiconductor circuit according to claim 7, further comprising:

a third circuit provided in a third path that couples a second signal terminal and the first power supply node, the third circuit being configured to enable the third path; and a fourth circuit provided in a fourth path that couples the second signal terminal and the second power supply node, the fourth circuit being configured to enable the fourth path, wherein the first operation includes controlling an operation of the third circuit to enable the third path during a third period that corresponds to a rising edge of a second input signal at the second signal terminal, and controlling an operation of the fourth circuit to enable the fourth path during a fourth period that corresponds to a falling edge of the second input signal.

13. The semiconductor circuit according to claim 12, wherein the control circuit is configured to perform the first operation in a case where a control signal is at a first logic level, and perform a second operation in a case where the control signal is at a second logic level, the second operation including controlling the operation of the first circuit to maintain the first path disabled, controlling the operation of the second circuit to maintain the second path disabled, controlling the operation of the third circuit to maintain the third path disabled, and controlling the operation of the fourth circuit to maintain the fourth path disabled.

* * * * *